(12) United States Patent
Wang et al.

(10) Patent No.: US 11,678,592 B2
(45) Date of Patent: Jun. 13, 2023

(54) STEP HEIGHT MITIGATION IN RESISTIVE RANDOM ACCESS MEMORY STRUCTURES

(71) Applicant: Taiwan Semiconductor Manufacturing Co., Ltd., Hsinchu (TW)

(72) Inventors: Wei-Ming Wang, Taichung (TW); Chia-Wei Liu, Zhubei (TW); Jen-Sheng Yang, Keelung (TW); Wen-Ting Chu, Kaohsiung (TW); Yu-Wen Liao, New Taipei (TW); Huei-Tzu Wang, Yilan (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 56 days.

(21) Appl. No.: 17/329,247

(22) Filed: May 25, 2021

(65) Prior Publication Data

US 2021/0280783 A1    Sep. 9, 2021

Related U.S. Application Data

(62) Division of application No. 16/422,207, filed on May 24, 2019, now Pat. No. 11,038,108.

(51) Int. Cl.
*H01L 45/00* (2006.01)

(52) U.S. Cl.
CPC ...... *H01L 45/1675* (2013.01); *H01L 45/1233* (2013.01); *H01L 45/146* (2013.01); *H01L 45/1608* (2013.01)

(58) Field of Classification Search
CPC .................................................. H01L 45/1675
See application file for complete search history.

(56) References Cited

U.S. PATENT DOCUMENTS

| 7,741,636 B2 | 6/2010 | Ho |
| 9,825,117 B2 | 11/2017 | Huang et al. |

(Continued)

FOREIGN PATENT DOCUMENTS

| KR | 20150128663 | 11/2015 |
| KR | 20170122660 | 11/2017 |

(Continued)

*Primary Examiner* — Daniel Luke
(74) *Attorney, Agent, or Firm* — Sterne, Kessler, Goldstein & Fox P.L.L.C.

(57) ABSTRACT

The present disclosure is directed to a method for the formation of resistive random-access memory (RRAM) structures with a low profile between or within metallization layers. For example, the method includes forming, on a substrate, a first metallization layer with conductive structures and a first dielectric layer abutting sidewall surfaces of the conductive structures; etching a portion of the first dielectric layer to expose a portion of the sidewall surfaces of the conductive structures; depositing a memory stack on the first metallization layer, the exposed portion of the sidewall surfaces, and a top surface of the conductive structures; patterning the memory stack to form a memory structure that covers the exposed portion of the sidewall surfaces and the top surface of the conductive structures; depositing a second dielectric layer to encapsulate the memory stack; and forming a second metallization layer on the second dielectric layer.

20 Claims, 23 Drawing Sheets

(56) References Cited

U.S. PATENT DOCUMENTS

| | | |
|---|---|---|
| 9,853,215 B1 | 12/2017 | Tseng et al. |
| 9,997,563 B2 | 6/2018 | Lee et al. |
| 10,163,981 B2 | 12/2018 | Chen et al. |
| 10,516,106 B2 | 12/2019 | Chu et al. |
| 10,559,493 B1 * | 2/2020 | Leobandung ....... H01L 45/1233 |
| 10,573,811 B2 | 2/2020 | Tseng et al. |
| 10,672,983 B2 * | 6/2020 | Leobandung ....... H01L 45/1233 |
| 10,727,407 B2 * | 7/2020 | Ando .................. H01L 45/1233 |
| 2009/0008621 A1 | 1/2009 | Lin et al. |
| 2016/0035975 A1 | 2/2016 | Chen et al. |
| 2019/0165269 A1 | 5/2019 | Ando et al. |

FOREIGN PATENT DOCUMENTS

| | | |
|---|---|---|
| KR | 20190001555 | 1/2019 |
| TW | 200727413 A | 7/2007 |
| TW | 201911315 A | 3/2019 |

* cited by examiner

STEP HEIGHT MITIGATION IN RESISTIVE RANDOM ACCESS MEMORY STRUCTURES

This application is a divisional application of U.S. Non-Provisional patent application Ser. No. 16/422,207, titled "Step Height Mitigation in Resistive Random Access Memory Structures," which was filed on May 24, 2019 and is incorporated herein by reference in its entirety.

BACKGROUND

In integrated circuits, resistive random-access memory (RRAM) structures can be formed in the back end of the line (BEOL) between layers of interconnect structures (e.g., lines and vias) filled with a metal (e.g., copper) or a metal alloy (e.g., copper alloy). As the line and via pitch in the interconnect layers shrink with each technology generation (e.g., node), the space between the RRAM structures is also reduced. This means that filling a space between adjacent RRAM structures with one or more dielectric materials can be challenging for future nodes.

BRIEF DESCRIPTION OF THE DRAWINGS

Aspects of the present disclosure are best understood from the following detailed description when read with the accompanying figures. It is noted that, in accordance with the common practice in the industry, various features are not drawn to scale. In fact, the dimensions of the various features may be arbitrarily increased or reduced for clarity of discussion.

DETAILED DESCRIPTION

Figure 1:
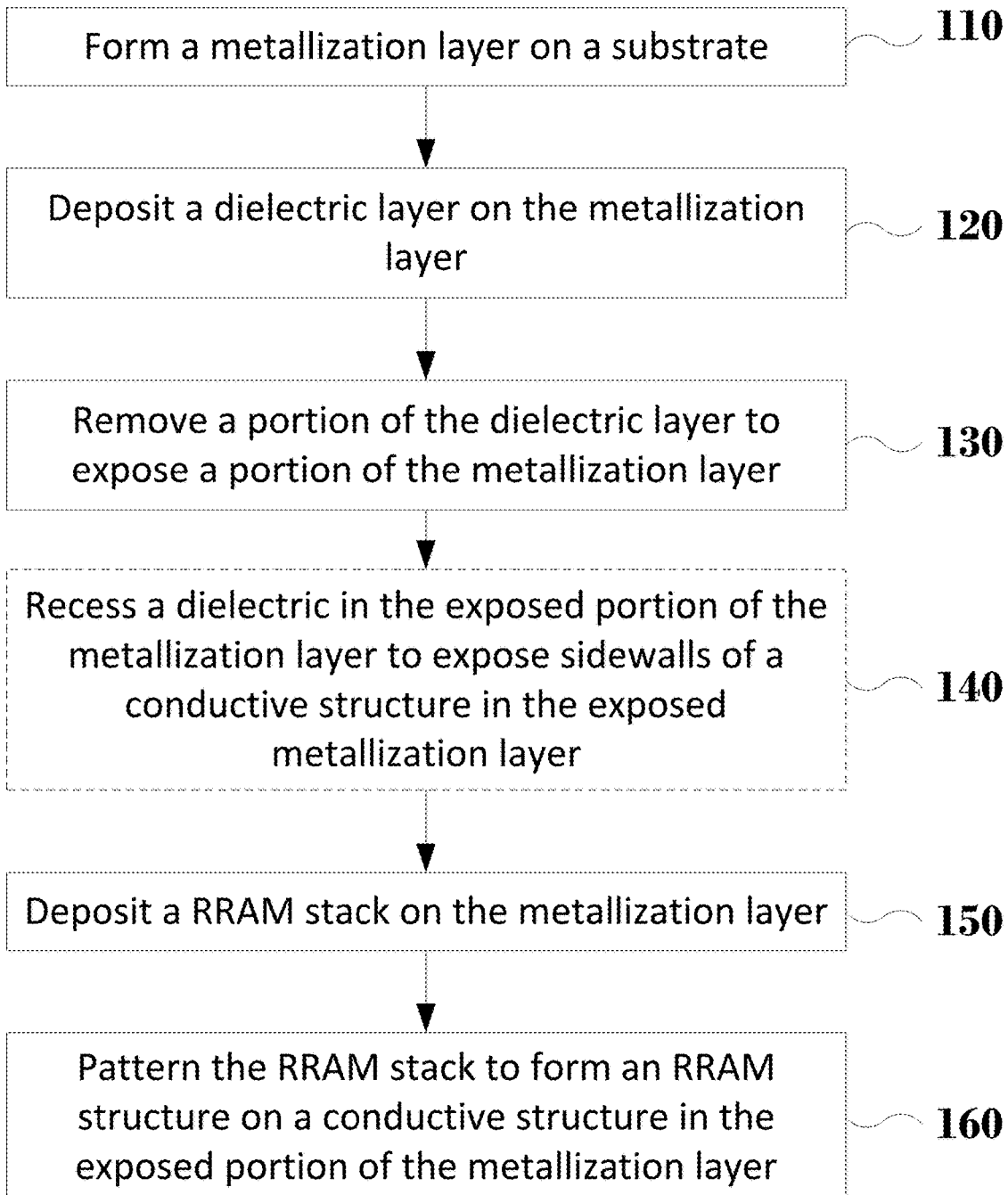
FIG. 1 is a flow chart of a method for forming RRAM structures with a low profile, according to some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature on a second feature in the description that follows may include embodiments in which the first and second features are formed in direct contact, and may also include embodiments in which additional features may be formed between the first and second features, such that the first and second features may not be in direct contact.

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "nominal" as used herein refers to a desired, or target, value of a characteristic or parameter for a component or a process operation, set during the design phase of a product or a process, together with a range of values above and/or below the desired value. The range of values is typically due to slight variations in manufacturing processes or tolerances.

The term "substantially" as used herein indicates the value of a given quantity that can vary based on a particular technology node associated with the subject semiconductor device. In some embodiments, based on the particular technology node, the term "substantially" can indicate a value of a given quantity that varies within, for example, ±5% of a target (or intended) value.

The term "about" as used herein indicates the value of a given quantity that can vary based on a particular technology node associated with the subject semiconductor device. In some embodiments, based on the particular technology node, the term "about" can indicate a value of a given quantity that varies within, for example, 5-30% of the value (e.g., ±5%, ±20%, or ±30% of the value).

The term "vertical," as used herein, means nominally perpendicular to the surface of a substrate.

Resistive random-access memory (RRAM) is a type of non-volatile memory. An RRAM cell can store a bit of data using resistance. More specifically, the RRAM cell includes a resistive material layer, the resistance of which can be adjusted to represent a logic "0" or a logic "1." RRAMs operate under the principle that a dielectric material can be engineered to conduct current via a "filament" or a "conduction path" formed after the application of a voltage across a pair of electrodes that surrounds the dielectric material. The conduction path can arise from different mechanisms, including vacancies in the dielectric material, metal defect migration, and/or other mechanisms. The formation of the filament, or the conduction path, is part of the "forming operation" or formation process (e.g., programing) of the RRAM cell. Once the filament or the conduction path is established, it may be reset ("broken," resulting in a higher resistance) or set ("re-formed," resulting in a lower resistance) by another voltage. The low-resistance path can be either localized (e.g., limited to the area of the filament) or homogeneous (e.g., throughout the dielectric between the two electrodes).

RRAM structures can be integrated with (e.g., embedded in) complementary metal oxide semiconductor (CMOS) integrated circuits (ICs) within a chip. By way of example and not limitation, RRAM structures can be formed in back-end of the line (BEOL) between interconnect layers that each includes a network of vertical and lateral conductive structures, such as vias and lines. RRAM structures can be formed on one or more conductive structures of an interconnect layer. For example, an RRAM array can include multiple RRAM structures formed on consecutive (e.g., adjacent) conductive structures (e.g., vias or lines) of an interconnect layer. As a result, the space between two adjacent RRAM structures (e.g., the RRAM pitch) of the RRAM array depends on (or is governed by) the line or via pitch of the interconnect layer. Since the line or via pitch of the interconnect layers is continuously reduced with each technology generation (e.g., node), the RRAM pitch will also decrease accordingly.

Dielectric layers, which are deposited after the formation of the RRAM structures, fill the space between adjacent RRAM structures or between RRAM structures and other conductive structures of the interconnect layer. Defects such as voids or air-pockets may occur during the deposition of the one or more subsequent dielectric layers. Voids in the dielectric layer(s) are undesirable. This is because voids embedded in the dielectric layer can be exposed during dielectric planarization and filled with one or more conductive materials that can electrically short the RRAM structures. Voids in the dielectric layer can also compromise the mechanical rigidity of the interconnect layer, which may become mechanically weak and collapse during dielectric planarization.

The embodiments described herein are directed to a method for the formation of RRAM structures with a low profile (e.g., with a reduced height of between about 27 nm and about 33 nm) between or within metallization layers. The low profile or reduced height facilitates the subsequent deposition of one or more dielectric layers between the RRAM structures or between the RRAM structures and the conductive structures of the metallization layers. In some embodiments, the RRAM structures with low profile reduce the risk of void formation during the deposition of subsequent dielectric layers. Therefore, embodiments described herein can be suitable for ICs with reduced via and line pitch.

In some embodiments, an RRAM structure with a low profile can be formed when the RRAM structure "wraps around" the sidewall surfaces of the conductive structure. This can be made possible when a recess is formed in a dielectric layer of the metallization layer that exposes the sidewall surfaces of the conductive structure prior to the formation of the RRAM structure. In some embodiments, the recess height is equal to or less than a height of the conductive structure. In some embodiments, the sidewall surfaces of a conductive structure are covered partially or completely with layers from the RRAM structure. In some embodiments, the RRAM structure is formed on a top surface of the conductive structure. A top electrode of an RRAM structure can be patterned compared to a bottom electrode of the RRAM structure so that spacers can be formed on the sidewall surface of the top electrode to improve electrical isolation between the top and bottom electrodes, according to some embodiments. In some embodiments, the sidewall surfaces of the RRAM structures are substantially vertical (e.g., about 90°).

FIG. 1 is a flowchart of a fabrication method 100 for forming an RRAM structure with a low profile, according to some embodiments. This disclosure is not limited to this operational description and other operations are within the spirit and scope of the present disclosure. Additional operations, not shown in method 100, may be performed. Moreover, not all operations may be needed to perform the disclosure provided herein. Additionally, some of the operations shown in FIG. 1 may be performed simultaneously or in a different order. In some embodiments, one or more other operations may be performed in addition to, or in place of, the presently described operations. For illustrative purposes, method 100 will be described with reference to the embodiments shown in FIGS. 2 through 23.

Figure 2:
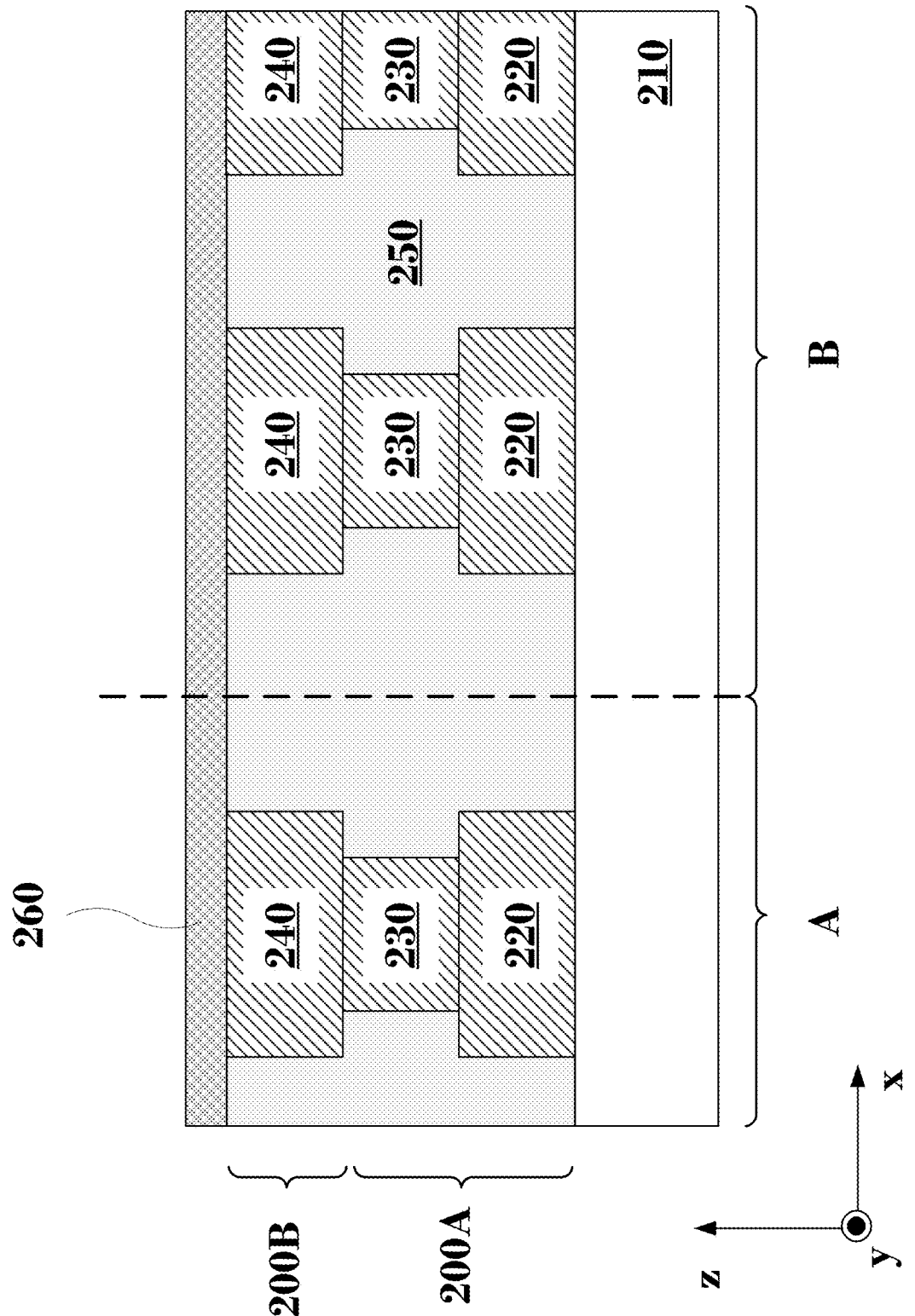
FIG. 2 is a cross-sectional view of a dielectric layer on metallization layers formed on a substrate, according to some embodiments.

Referring to FIG. 1, method 100 begins with operation 110 and the formation of a metallization layer on a substrate. By way of example and not limitation, FIG. 2 is a partial cross-sectional view of a metallization layer 200B formed on substrate 210. In some embodiments, additional metallization layers may be formed between metallization layer 200B and substrate 210—such as metallization layer 200A. According to some embodiments, metallization layers 200A and 200B can be, for example, BEOL interconnect layers that include conductive structures 220, 230, and 240. By way of example and not limitation, conductive structures 220 and 240 can be electrically connected to each other through conductive structures 230. Further, conductive structures 220 and 240 can be lines extending laterally along the x-y plane, and conductive structures 230 can be vias extending vertically along the z-axis. Metallization layers 200A and 200B can also include additional conductive structures (e.g., additional lines, vias, or combinations thereof) not shown in the cross-sectional view of FIG. 2. In some embodiments, conductive structures 220, 230, and 240 are filled with a conductive material or a stack of conductive materials—such as a metal or a metal alloy. In some embodiments, conductive structures 220, 230, and 240 further include a liner layer (not shown in FIG. 2 for simplicity) on which the conductive material is disposed. In some embodiments, the liner layer covers the sidewall and bottom surfaces of conductive structures 220, 230, and 240 to prevent out-diffusion of the conductive material from conductive structures 220, 230, and 240 to layers below metallization layers 200A and 200B.

Conductive structures 220, 230, and 240 are embedded in a dielectric layer 250. By way of example and not limitation, dielectric layer 250 can be an interlayer dielectric (ILD) (e.g., a dielectric between adjacent layers), such as a dielectric with a dielectric constant value ("k-value") below about 3.9 (e.g., about 3.2, about 3.0, about 2.9, about 2.5, etc.). In some embodiments, dielectric layer 250 can be a stack of dielectrics, such as a low-k dielectric and another dielectric: (i) a low-k dielectric (e.g., carbon doped silicon oxide) and a silicon carbide with nitrogen doping; (ii) a low-k dielectric (e.g., carbon doped silicon oxide) and a silicon carbide with oxygen doping; (iii) a low-k dielectric (e.g., carbon doped silicon oxide) with silicon nitride; or (iv) a low-k dielectric (e.g., carbon doped silicon oxide) with silicon oxide. By way of example and not limitation, dielectric layer 250 can be deposited by a high-density chemical vapor deposition (HDCVD) process, a plasma-enhanced chemical vapor deposition process (PECVD), a plasma-enhanced atomic layer deposition process (PEALD), or any other suitable deposition process at a thickness between about 200 nm and about 100 nm. The aforementioned deposition thickness ranges, deposition methods, and materials are exemplary and not limiting. Therefore, other materials, deposition thickness ranges, and deposition methods are within the spirit and the scope of this disclosure.

In some embodiments, metallization layers 200A and 200B can be divided into regions A and B of substrate 210. By way of example and not limitation, region A can include a portion of metallization layers 200A and 200B, where RRAM structures are not formed; and region B can include another portion of metallization layers 200A and 200B, where RRAM structures are formed. In some embodiments, region A is a logic area of a chip and region B is a memory area of the chip. According to some embodiments, regions A and B may or may not be adjacent to each other and they can be separated by other areas of the chip not shown in FIG. 2.

Referring to FIG. 1, method 100 continues with operation 120 and the deposition of a dielectric layer 260 on metallization layer 200B as shown in FIG. 2. In some embodiments, dielectric layer 260 includes a silicon carbide layer, a silicon oxy-nitride layer, a silicon oxide layer, or a silicon nitride layer with a thickness between about 5 nm and about 80 nm (e.g., about 5 nm, about 10 nm, about 20 nm, about 30 nm, about 60 nm, about 80 nm). By way of example and not limitation, dielectric layer 260 can be deposited with a chemical vapor deposition (CVD) process, PECVD process, PEALD process, or any other suitable deposition process. In some embodiments, dielectric layer 260 serves as an etch stop layer (ESL) during the fabrication of RRAM structures or other memory structures on metallization layer 200B.

Figure 3:
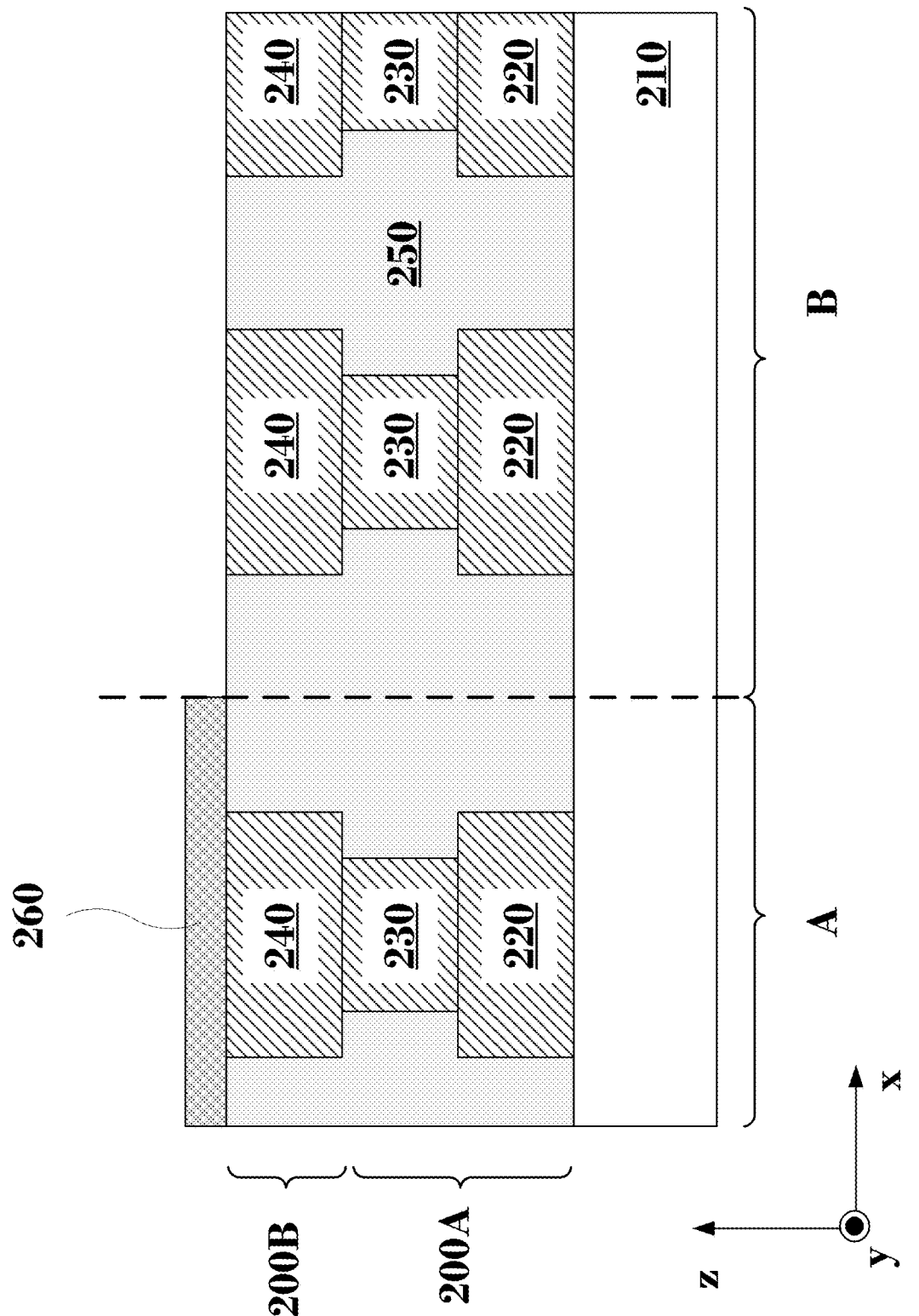
FIG. 3 is a cross-sectional view of a patterned dielectric layer on metallization layers formed on a substrate, according to some embodiments.

In referring to FIG. 1, method 100 continues with operation 130, where a portion of dielectric layer 260 is removed (e.g., patterned) to expose a portion of metallization layer 200B. In some embodiments, dielectric layer 260 is selectively removed on metallization layer 200B in region B of substrate 210, as shown in FIG. 3. This is because region B of substrate 210 is where RRAM structures will be formed (e.g., a memory area of a chip). By way of example and not limitation, the selective removal of dielectric layer 260 can be accomplished with photolithography and etching operations. For example, a photoresist layer (not shown in FIG. 2) can be disposed (e.g., spin coated) on dielectric layer 260.

Subsequently, the photoresist layer can be patterned (e.g., by using a photo mask or reticle, exposure and develop of the photoresist, and etching operations) to form an opening in the photoresist layer that exposes a portion of underlying dielectric layer 260. In some embodiments, the opening in the photoresist layer exposes a portion of underlying dielectric layer 260 on region B of substrate 210. On the other hand, region A of substrate 210 remains covered by the patterned photoresist, which acts as an etching mask. An etching operation, such as dry etching, can remove exposed portions of dielectric layer 260 through the opening in the photoresist layer to expose underlying top surfaces of dielectric layer 250 and conductive structures 240 of metallization layer 200B. In some embodiments, the etching operation in dielectric layer 260 may include one or more etching sub-operations with a halogen-based etching chemistry, such as a fluorine-based chemistry, a chlorine-based chemistry, or combinations thereof.

After the removal of dielectric layer 260 from region B of substrate 210, the patterned photoresist layer used in the removal process can be removed with a wet etching process, a dry etching process, combinations thereof, or another suitable photoresist removal process. The resulting structure is shown in FIG. 3, according to some embodiments.

Figure 4:
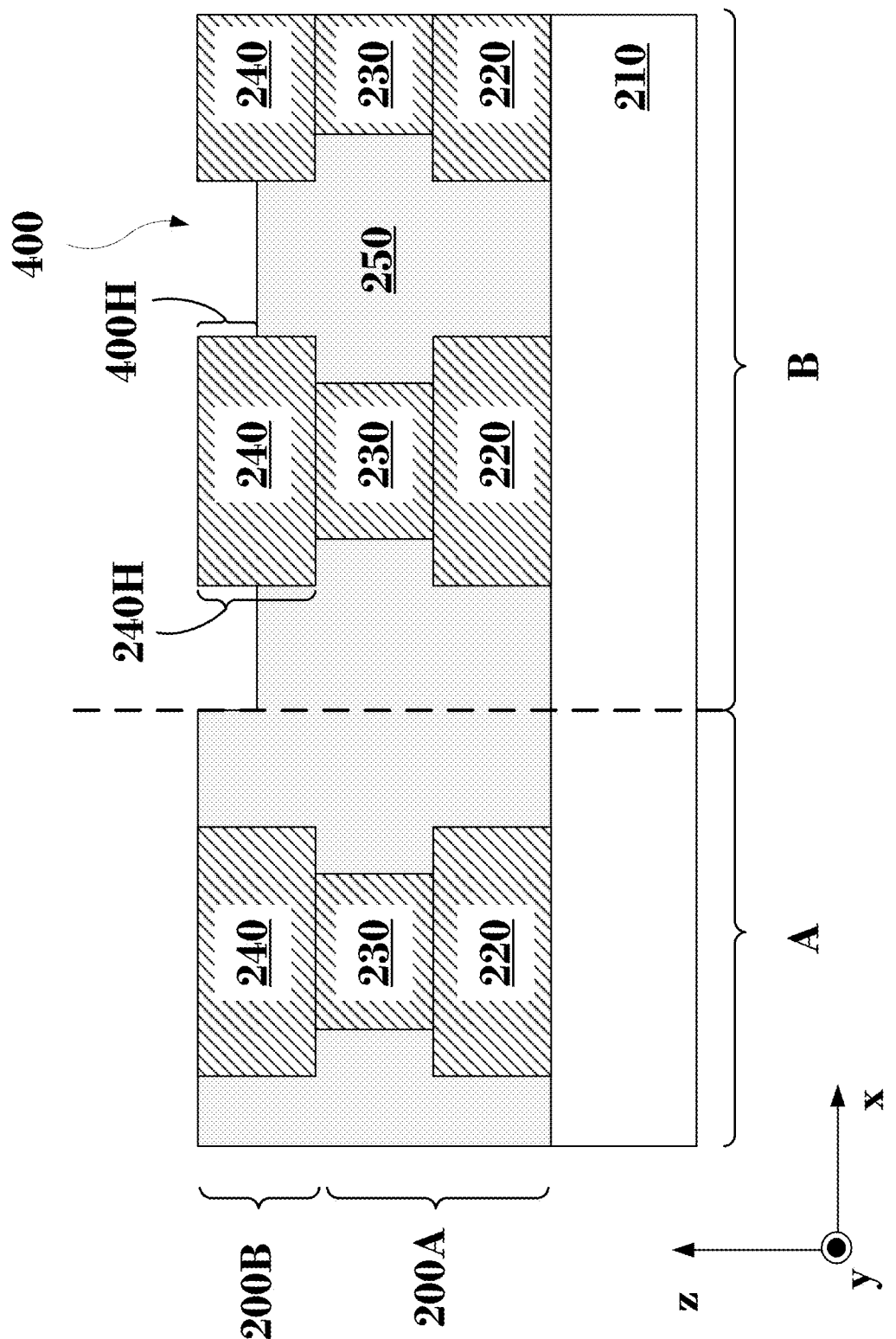
FIG. 4 is a cross-sectional view of a recess formed in a metallization layer to expose sidewall surfaces of a conductive structure in the metallization layer, according to some embodiments.

Method 100 continues with optional operation 140 and the formation of a recess in dielectric layer 250 of exposed metallization layer 200B. The recess exposes the sidewall surfaces of a conductive structure 240 in exposed metallization layer 200B. In some embodiments, FIG. 4 shows the resulting structure after optional operation 140, where a recess 400 is formed in dielectric layer 250 to expose the sidewall surfaces of conductive structure 240. In some embodiments, recess 400 in dielectric layer 250 exposes the sidewall surfaces of multiple conductive structures 240. By way of example and not limitation, recess 400 can expose the sidewall surfaces of selective conductive structures 240 with the use of photolithography, where a patterned photoresist can be used as an etching mask to protect areas of dielectric layer 250 that will not be etched. In some embodiments, and during the recess formation, both regions A and B of substrate 210 are exposed to the etching chemistry of the etching process. As a result, dielectric layer 260 on region A (e.g., shown in FIG. 3) is consumed (e.g., etched) by the etching process, as shown in FIG. 4.

In some embodiments, the etching chemistry used in optional operation 140 has a different etch rate for dielectric layer 260 and dielectric layer 250. By way of example and not limitation, the etching selectivity ratio of dielectric layer 260 to dielectric layer 250 for the etching chemistry used in optional operation 140 can be about 1:2. In other words, the etching chemistry used in optional operation 140 etches dielectric layer 250 twice as fast as dielectric layer 260. This can be advantageous because the thickness of dielectric layer 260 can be used to control recess height 400H of recess 400 in dielectric layer 250. For example, when dielectric layer 260 is completely removed by the etching chemistry in region A (e.g., when metallization layer 200B in region A is exposed), the etching process can be terminated. This is important because if the etching process is allowed to continue, dielectric layer 250 in region A will be etched, like dielectric layer 250 in region B. Once the etching process is terminated, the resulting recess height 400H in region B will be about double the thickness of dielectric layer 260, since dielectric layer 250 is etched twice as fast as dielectric layer 260. Therefore, recess height 400H can be modulated with the thickness of dielectric layer 260.

In some embodiments, recess height 400H can be expressed as a percentage (%) of height 240H of exposed conductive structure 240. In some embodiments, recess height 400H can be up to about 100% of height 240H. In other words, recess 400 can expose a portion of the sidewall surfaces of conductive structure 240 or the entire sidewall surfaces of conductive structure 240. Therefore, 400H can be equal to or less than 240H (e.g., 400H≤240H). In some embodiments, height 240H, the thickness of dielectric layer 260, and the etching selectivity ratio of dielectric layer 260 to dielectric layer 250 have to be considered to achieve a desired recess height 400H. By way of example and not limitation, if the etching selectivity ratio of dielectric layer 260 to dielectric layer 250 is 1:2 and the desired recess height 400H is equal to height 240H, then the thickness of dielectric layer 260 is 0.5 times height 240H of conductive structure 240.

The aforementioned etching rate selectivity ratio is not limiting. This is because the etching rate selectivity ratio depends on at least the material selection for dielectric layers 250 and 260 and the etching chemistry. Therefore, different etching rate selectivity ratios are possible for a different materials for (i) dielectric layers 250 and 260 and (ii) the etching chemistry.

In some embodiments, the etching chemistry used in operation 140 is highly selective towards dielectric layers 250 and 260, as opposed to the materials used in conductive structures 240. By way of example and not limitation, the etching selectivity ratio between the dielectric layers (e.g., 250 and 260) and the materials in conductive structures 240 can be greater than 3:1 (e.g., about 3:1, about 5:1, about 10:1, about 20:1, etc.)

In some embodiments, method 100 may continue from operation 130 directly to operation 150 (e.g., skip optional operation 140). In this case, recess 400 will not be formed on region B of substrate 210.

Figure 5:
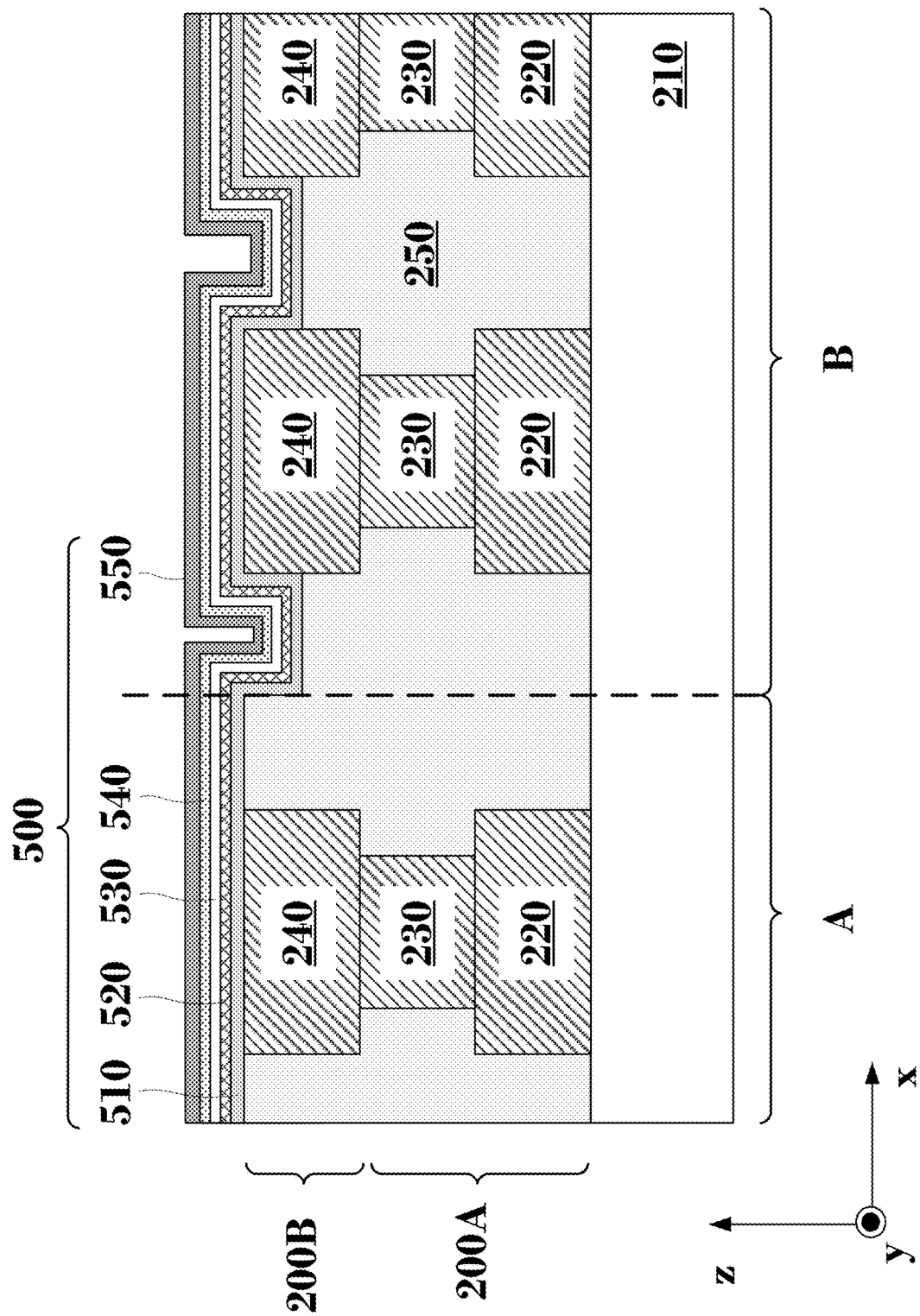
FIG. 5 is a cross-sectional view of an RRAM stack deposited on sidewall and top surfaces of a conductive structure in a metallization layer, according to some embodiments.

Referring to FIGS. 1 and 5, method 100 continues with operation 150, where an RRAM stack 500 is deposited on metallization layer 200B across both regions A and B of substrate 210. RRAM stack 500 can be deposited so that it covers the surfaces of recess 400 and the top surface of metallization layer 200B on both regions A and B. According to some embodiments, stack 500 includes layers 510, 520, 530, 540, and 550, which can be successively deposited. For example, layer 510 can be deposited first on the exposed surfaces of dielectric layer 250 (e.g., on the sidewall surfaces of recess 400 and the top surface of dielectric layer 250) and on the exposed conductive structures 240 (e.g., on the exposed top and sidewall surfaces of conductive structure 240). Subsequently, layers 520, 530, 540, and 550 can be successively deposited on layer 510 to form RRAM stack 500.

In some embodiments, layer 510 is a barrier layer that prevents out diffusion of conductive material from conductive structures 240 to the other RRAM layers (e.g., layers 520, 530, 540, and 550.) By way of example and not limitation, layer 510 can include tantalum nitride (TaN) or titanium nitride (TiN) deposited by physical vapor deposition (e.g., sputtering.) at a thickness between about 9 nm and about 11 nm. Layer 520 can be a metal, a metallic layer, or an alloy that functions as a bottom electrode of the RRAM structure. By way of example and not limitation, layer 520 can include a metal, such as gold (Au), platinum (Pt), ruthenium (Ru), iridium (Ir), titanium (Ti), aluminum (Al), copper (Cu), tantalum (Ta), tungsten (W); alloys such as iridium-tantalum alloy (Ir—Ta); oxides, such as indium-tin oxide (ITO); or combinations thereof. In some embodiments, layer 520 includes any alloys, oxides, nitrides, fluorides, carbides, borides or silicides of the aforementioned metals, such as tantalum nitride (TaN), titanium nitride (TiN), titanium aluminum nitride (TiAlN), titanium-tungsten alloy (TiW), or combinations thereof. By way of example and not limitation, layer 520 can be deposited by physical vapor deposition (PVD), metal-organic chemical vapor deposition (MOCVD), or CVD at a thickness between about 9 nm and about 11 nm. In some embodiments, the combined thickness of layers 510 and 520 can range from about 18 nm to about 22 nm (e.g., between about 18 nm and about 20 nm, between about 21 nm and about 22 nm) depending on the individual thickness of each layer (e.g., 510 and 520).

In some embodiments, layer 530 is a dielectric layer with a thickness that ranges between about 4.5 nm and about 5.5 nm (e.g., about 5 nm). By way of example and not limitation, layer 530 includes hafnium oxide, zirconium oxide, aluminum oxide, nickel oxide, tantalum oxide, or titanium oxide. According to some embodiments, layer 540 is a capping layer for layer 530. By way of example and not limitation layer 540 can be deposited by PVD at a thickness between about 11 nm and about 14 nm and can include Ta, Ti, hafnium (Hf), platinum (Pt), or other suitable materials.

According to some embodiments, layer 550 functions as a top electrode of the RRAM structure. Layer 550 can include the same or a different material from layer 520 (e.g., the bottom electrode). By way of example and not limitation, layer 550 can be deposited by PVD, MOCVD, or CVD at a thickness range between about 13 nm and about 17 nm (e.g., between about 13 nm and about 15 nm, between about 14 nm and about 17 nm).

In referring to FIG. 1, method 100 continues with operation 160 and the patterning of RRAM stack 500 to form an RRAM structure on a conductive structure 240. In some embodiments, dielectric layer 250 is recessed in the vicinity of conductive structure 240 so that the sidewall surfaces of conductive structure 240 are exposed. According to some embodiments, RRAM stack 500 is patterned so that RRAM stack 500 is removed from region A of substrate 210 and from selective portions of region B of substrate 210. As a result, one or more RRAM structures can be formed on respective one or more conductive structures 240 of metallization layer 200B in region B of substrate 210.

Figure 6:
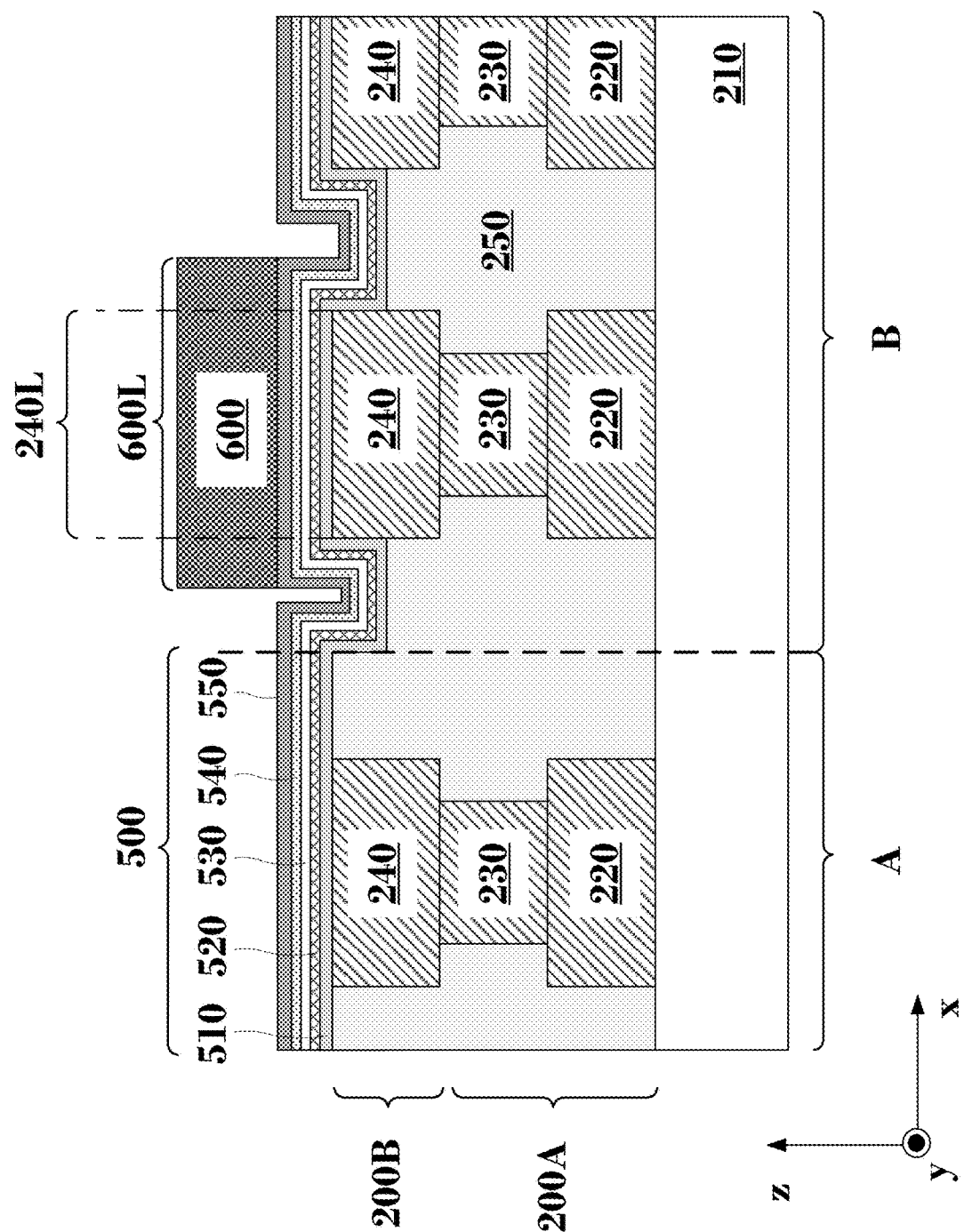
FIG. 6 is a cross-sectional view of a patterned photoresist on an RRAM stack deposited on sidewall and top surfaces of a conductive structure, according to some embodiments.

By way of example and not limitation, the patterning process involves photolithography and etching operations. For example, a photoresist layer can be deposited on RRAM stack 500 and subsequently patterned so that portions of RRAM stack 500 to be etched are exposed through openings in the patterned photoresist, while other portions of RRAM stack 500 to be protected are covered by the patterned photoresist. For example, FIG. 6 shows patterned photoresist 600 over conductive structure 240. In some embodiments, patterned photoresist 600 has a width 600L (e.g., along the x-axis) larger than width 240L of conductive structure 240 (i.e., 600L>240L). This is because, after the formation of the RRAM structure, it may be desirable that the layers of RRAM stack 500 (e.g., layers 510, 520, 530, 540, and 550) remain on the sidewall surfaces of conductive structure 240. In some embodiments, width 600L of patterned photoresist 600 can determine which layers from RRAM stack 500 will remain on the sidewall surfaces of conductive structure 240 after the formation of the RRAM structure.

Figure 7:
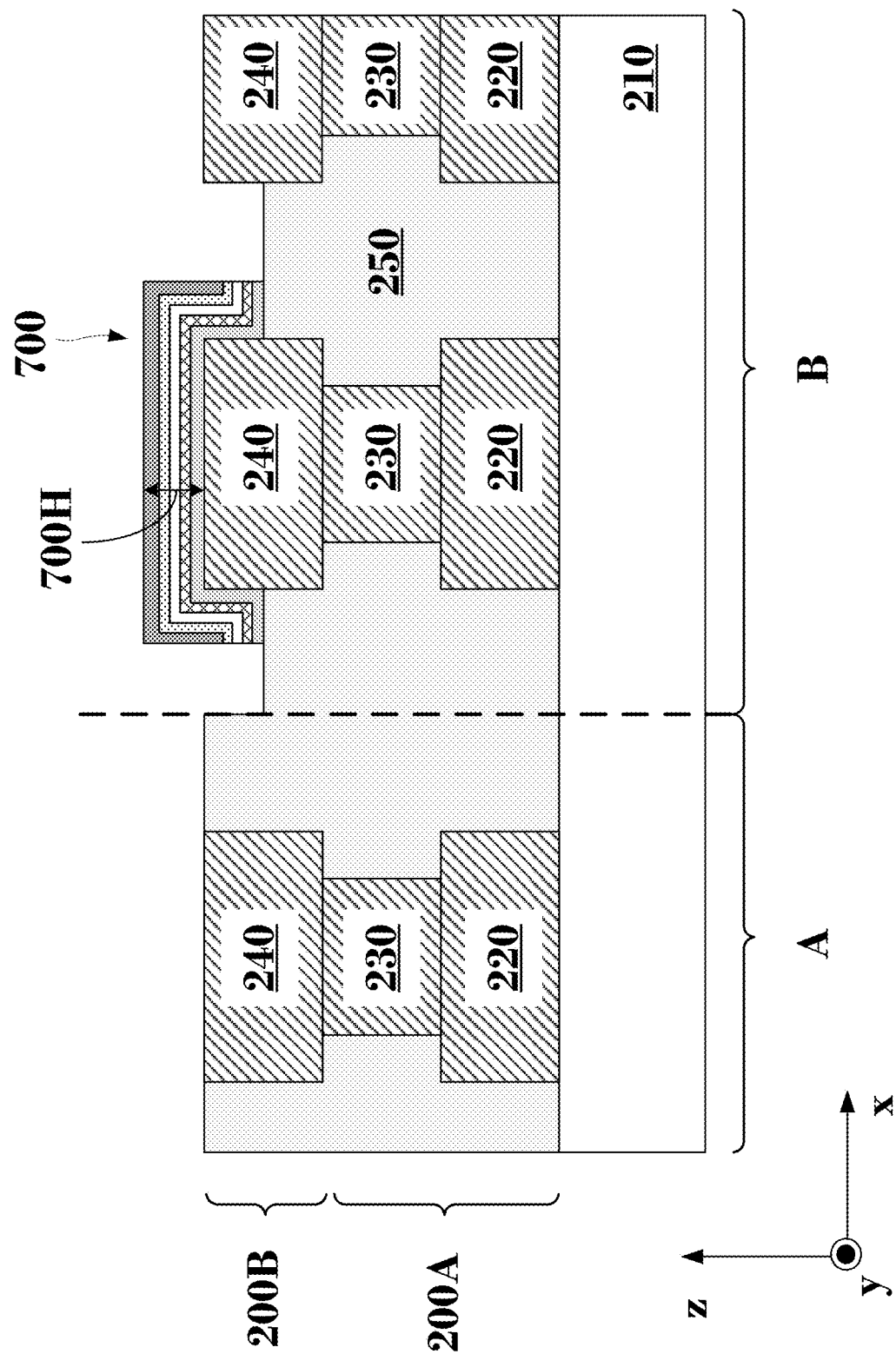
FIG. 7 is a cross-sectional view of an RRAM structure formed on sidewall and top surfaces of a conductive structure, according to some embodiments.

An etching process can subsequently remove the exposed portions of RRAM stack 500 to expose metallization layer 200B on region A and portions of metallization layer 200B on region B. In some embodiments, the etching process is anisotropic so that the resulting RRAM stack is formed with substantially vertical sidewall surfaces. According to some embodiments, FIG. 7 shows the resulting RRAM structure 700 after the etching operation and the subsequent removal of patterned photoresist 600. Because the layers of RRAM stack 500 are deposited on metallization layer 200B in region B of substrate 210 without the presence of any intervening layers, the resulting RRAM structure 700 has a reduced height 700H (e.g., between about 27 nm and about 30 nm) on conductive structure 240. In some embodiments, the height reduction achieved in RRAM structure 700 is about 30 nm.

Figure 8:
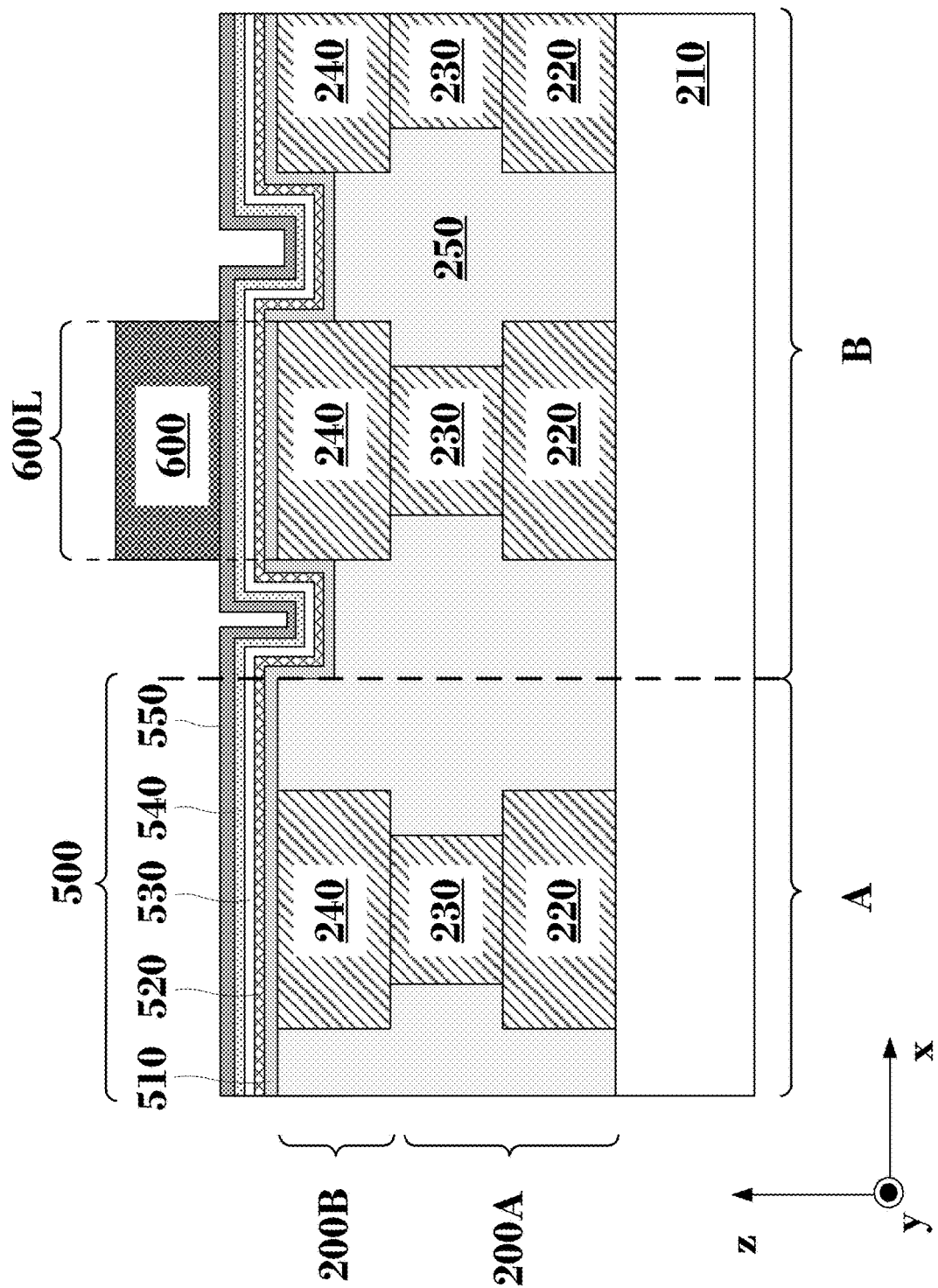
FIG. 8 is a cross-sectional view of a patterned photoresist on an RRAM stack deposited on sidewall and top surfaces of a conductive structure, according to some embodiments.
Figure 9:
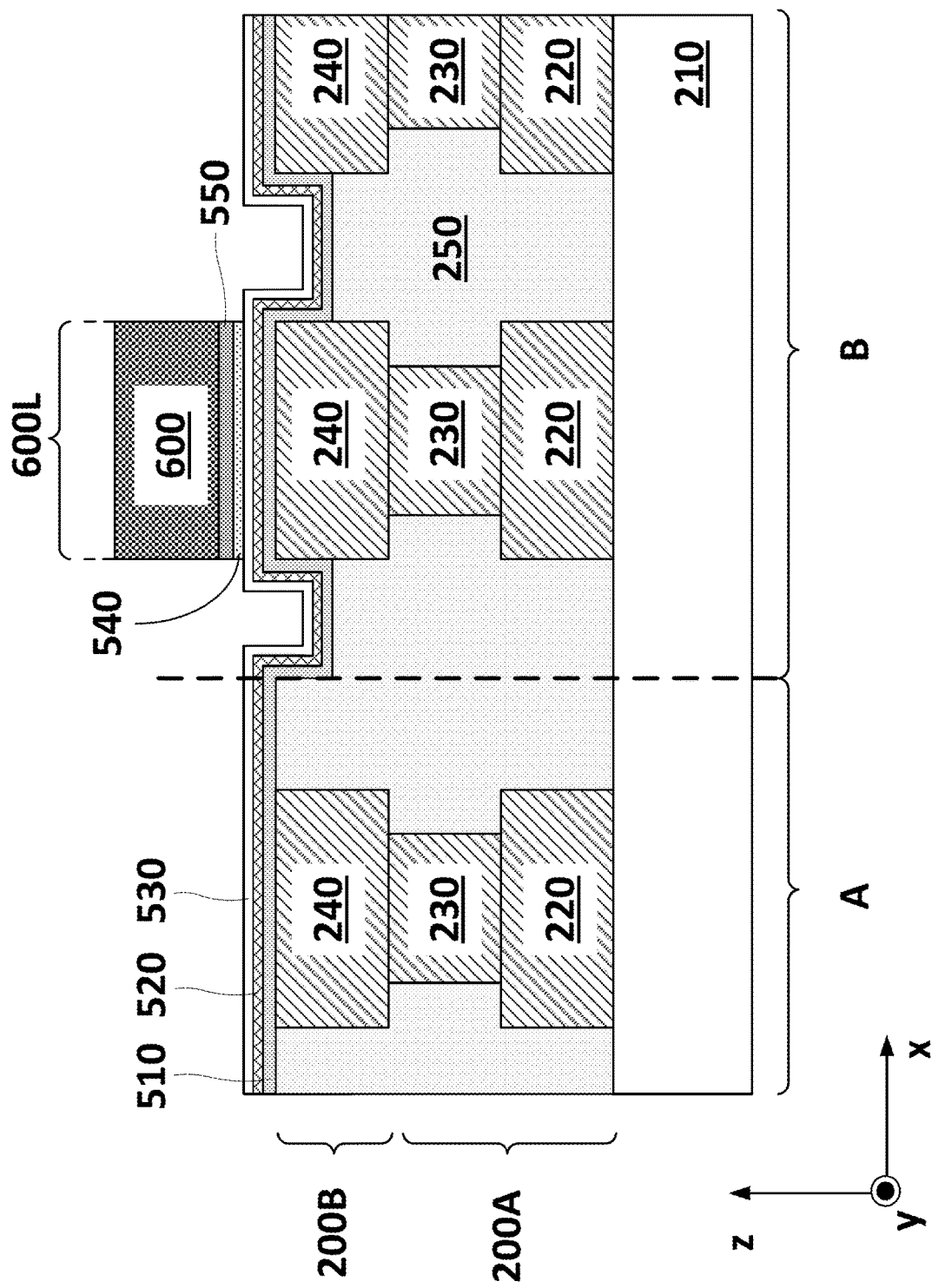
FIG. 9 is a cross-sectional view of an RRAM stack with patterned layers, according to some embodiments.
Figure 10:
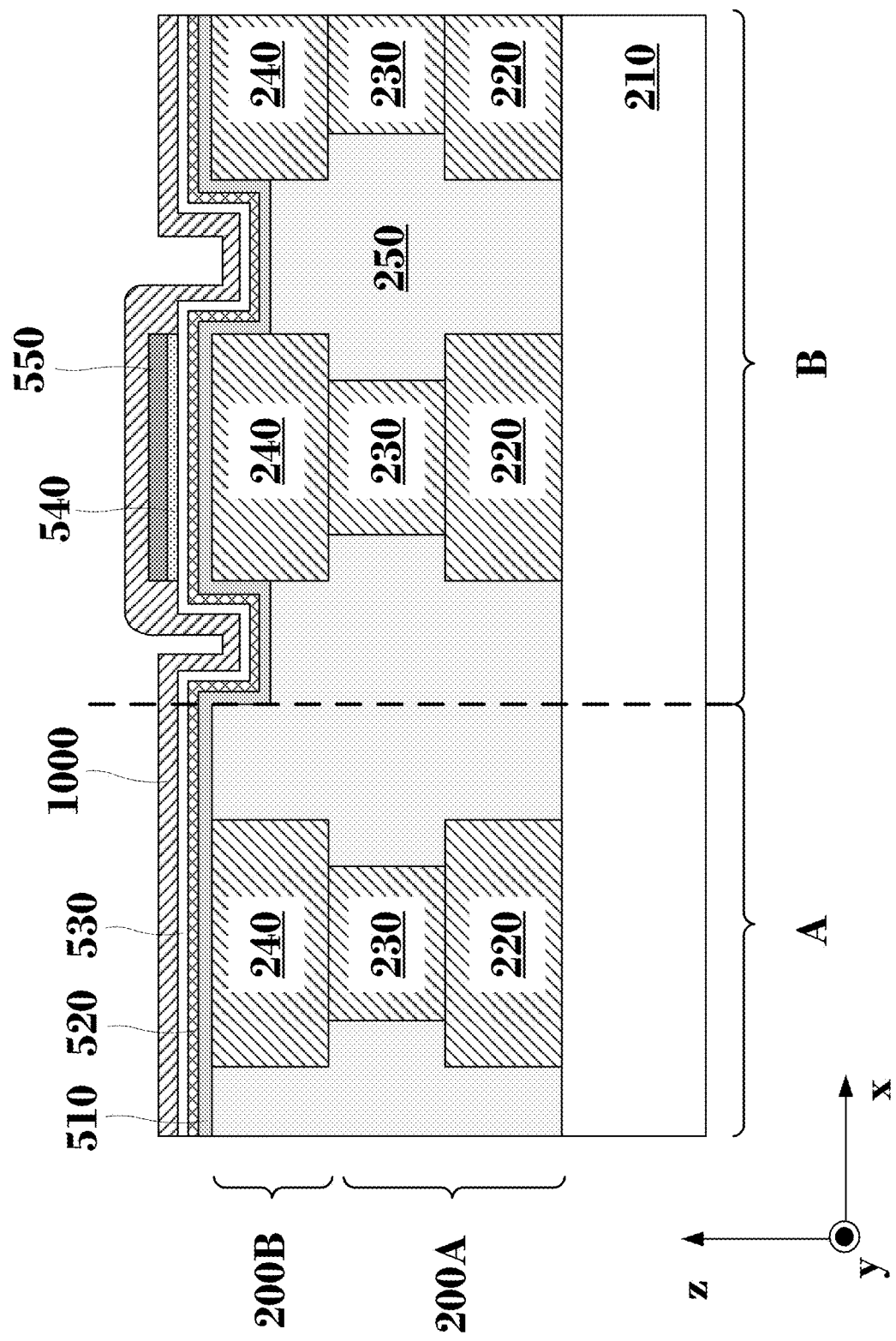
FIG. 10 is a cross-sectional view of a spacer material deposited on an RRAM stack with patterned layers, according to some embodiments.
Figure 11:
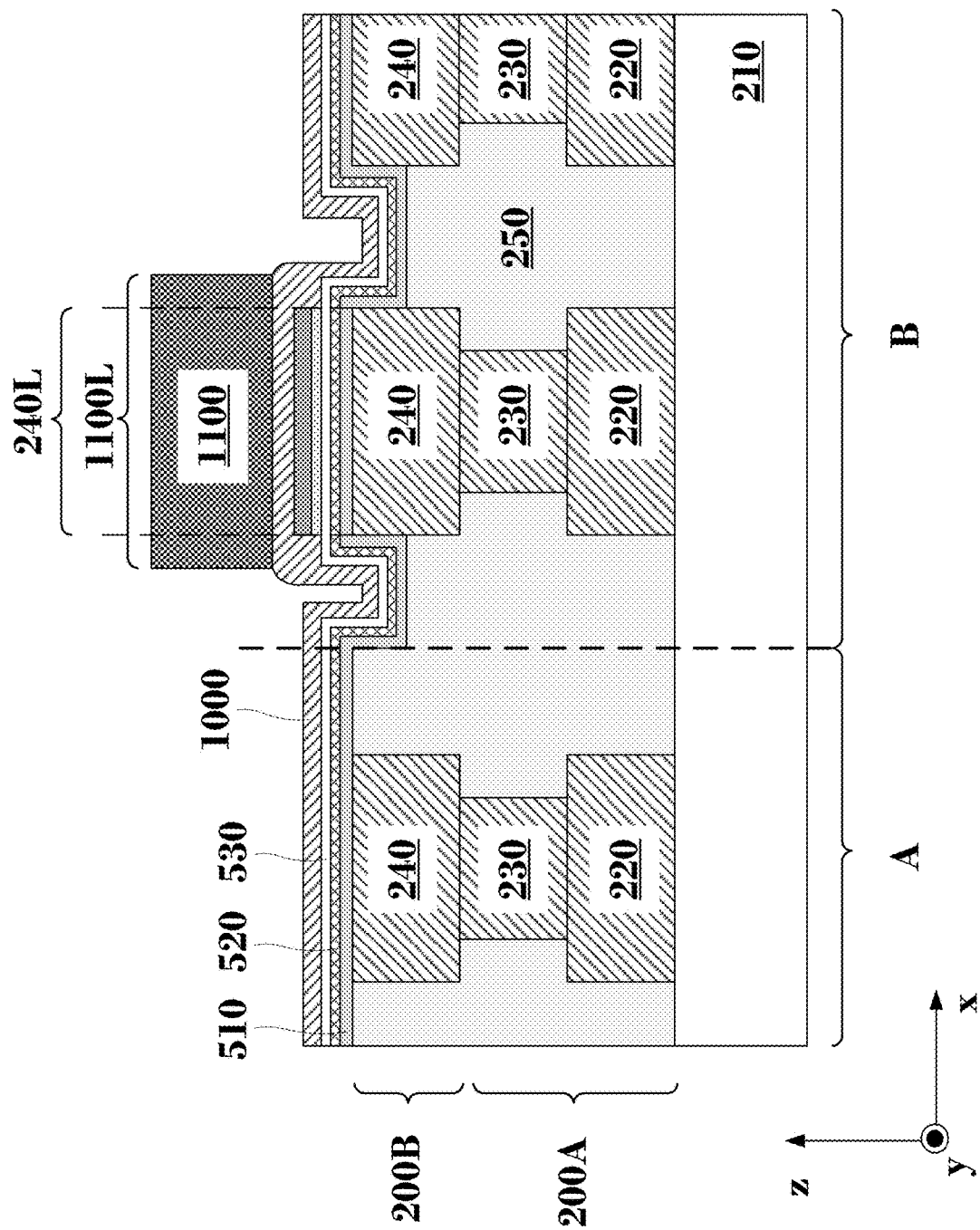
FIG. 11 is a cross-sectional view of patterned photoresist on a spacer material deposited on an RRAM stack with patterned layers, according to some embodiments.

In some embodiments, a variation of RRAM structure 700 is possible with additional photolithography and etching operations. For example, if photoresist 600 is patterned so that its width 600L is substantially equal to the width of conductive structure 240—e.g., as shown in FIG. 8—then a subsequent etching process can selectively remove portions of layers 550 and 540 not covered by patterned photoresist 600, as shown in FIG. 9. Layers 510, 520, and 530 are not removed by the aforementioned etching process. Subsequently, patterned photoresist 600 can be removed and a spacer material 1000 can be deposited on the exposed layers of the RRAM stack, as shown in FIG. 10. By way of example and not limitation, spacer material 1000 can include a nitride, such as silicon nitride, or another suitable material. A second patterned photoresist layer 1100 with a width 1100L (e.g., along the x-axis) larger than width 240L of conductive structure 240 (e.g., 1100L>240L) can be formed on conductive structure 240, as shown in FIG. 11.

Figure 12:
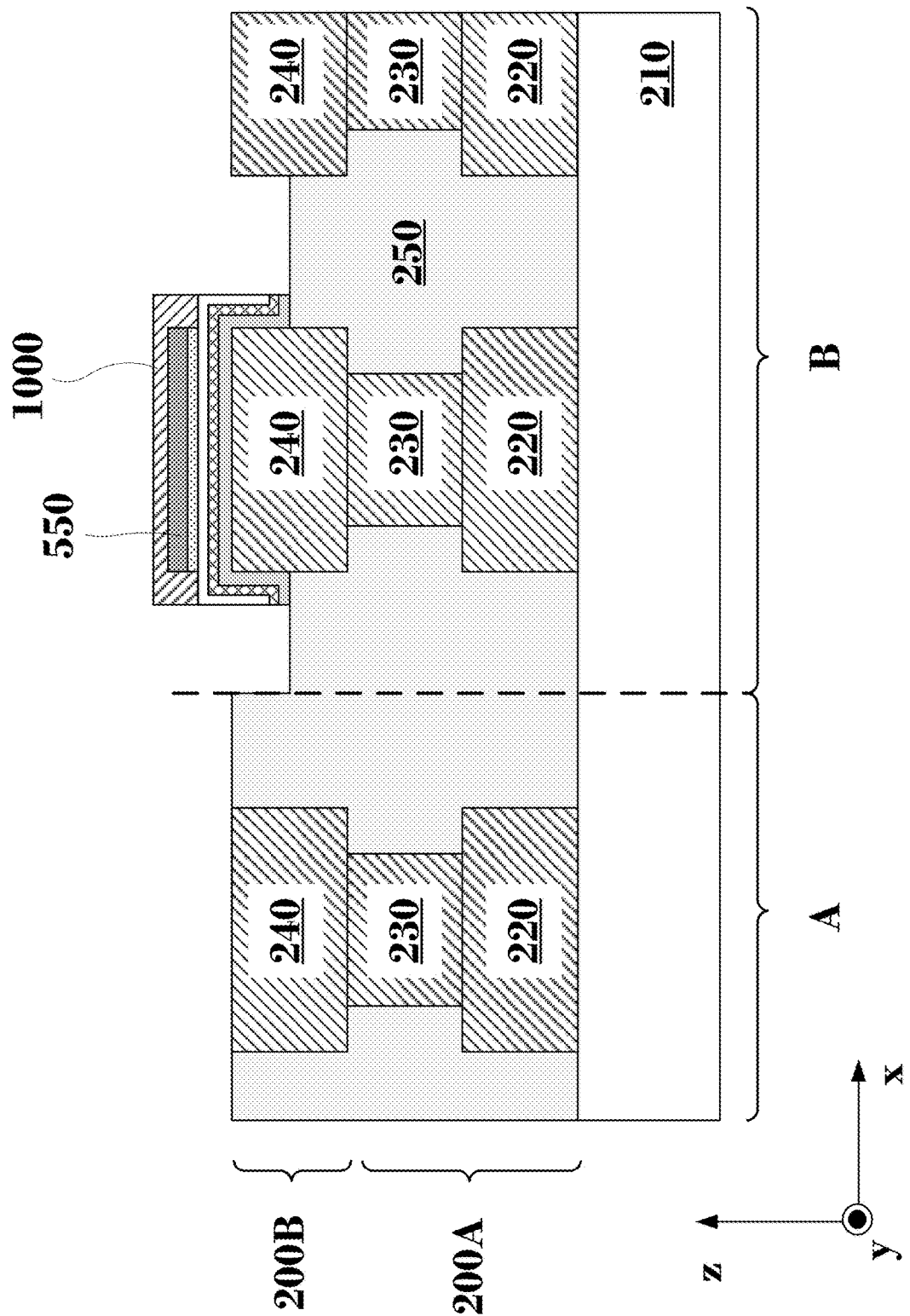
FIG. 12 is a cross-sectional view of a patterned spacer material deposited on an RRAM structure with patterned layers, according to some embodiments.
Figure 13:
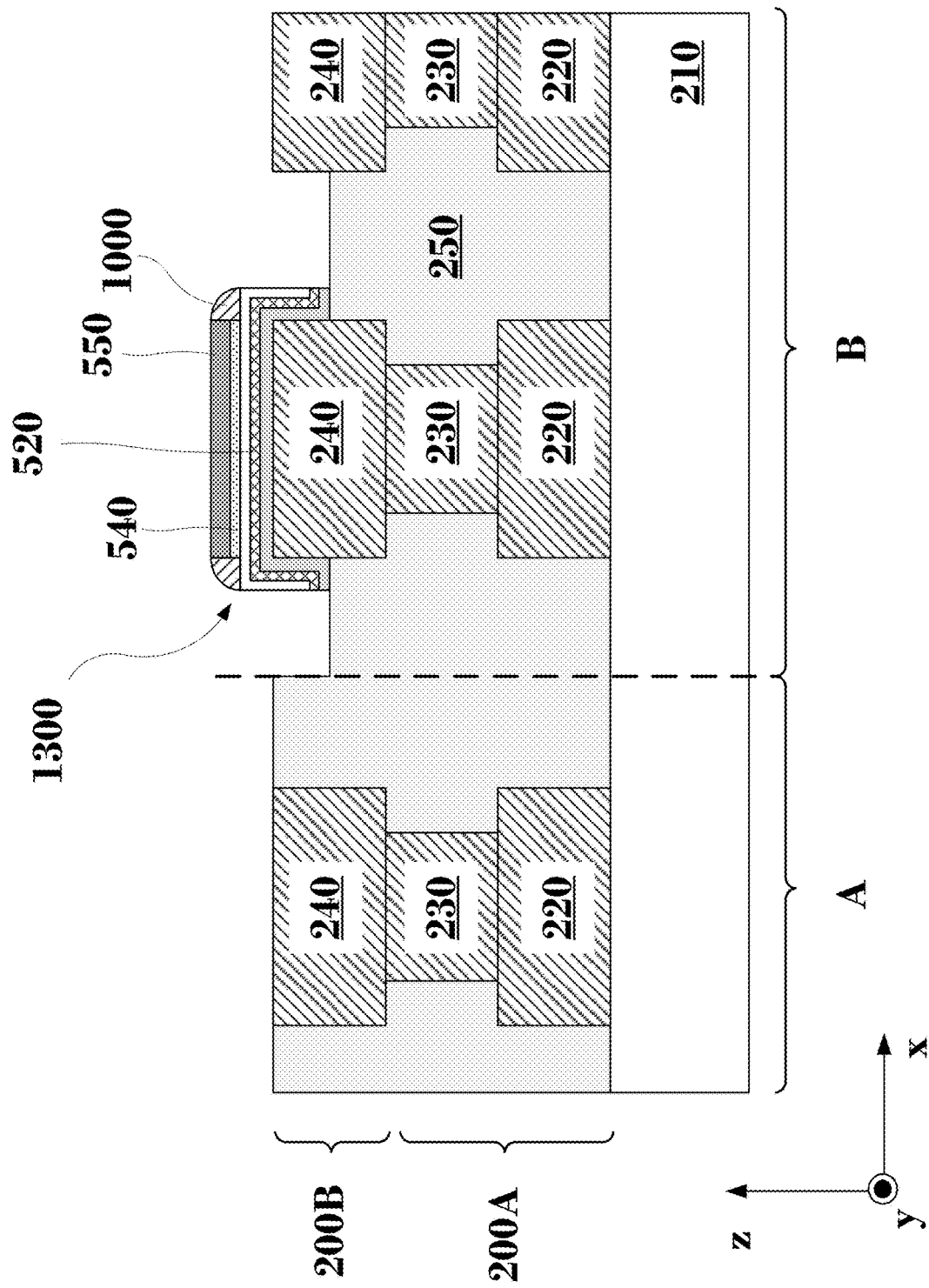
FIG. 13 a cross-sectional view of an RRAM structure, formed on sidewall and top surfaces of a conductive structure, with patterned layers and spacers formed on sidewall surfaces of the patterned layers, according to some embodiments.

A subsequent etching process can remove portions of spacer material 1000 and the remaining layers of the RRAM stack not covered by patterned photoresist layer 1100 (e.g., layers 510, 520, and 530). Once the etching process is complete, patterned photoresist layer 1100 can be removed as shown in FIG. 12. Finally, an anisotropic dry etching process can remove spacer material 1000 from the top surface of layer 550. The resulting RRAM structure 1300 is shown in FIG. 13. According to some embodiments, RRAM structure 1300—as opposed to RRAM structure 700 of FIG. 7—includes patterned layers 540 and 530 that do not "wrap around" the sidewall surfaces of conductive structure 240, and spacer material 1000 on the sidewall surfaces of patterned layers 550 and 540. Spacer material 1000 prevents layer 550 (e.g., the top electrode of RRAM structure 1300) from electrically shorting with layer 520 (e.g., the bottom electrode of RRAM structure 1300) if, during the patterning operation of RRAM stack 500 (e.g., operation 160 of method 1 shown in FIG. 1), polymer from the etching process is not adequately removed from the sidewall surfaces of the RRAM stack. In some embodiments, spacer material 1000 becomes rounded during the aforementioned anisotropic drying etching process.

Figure 14:
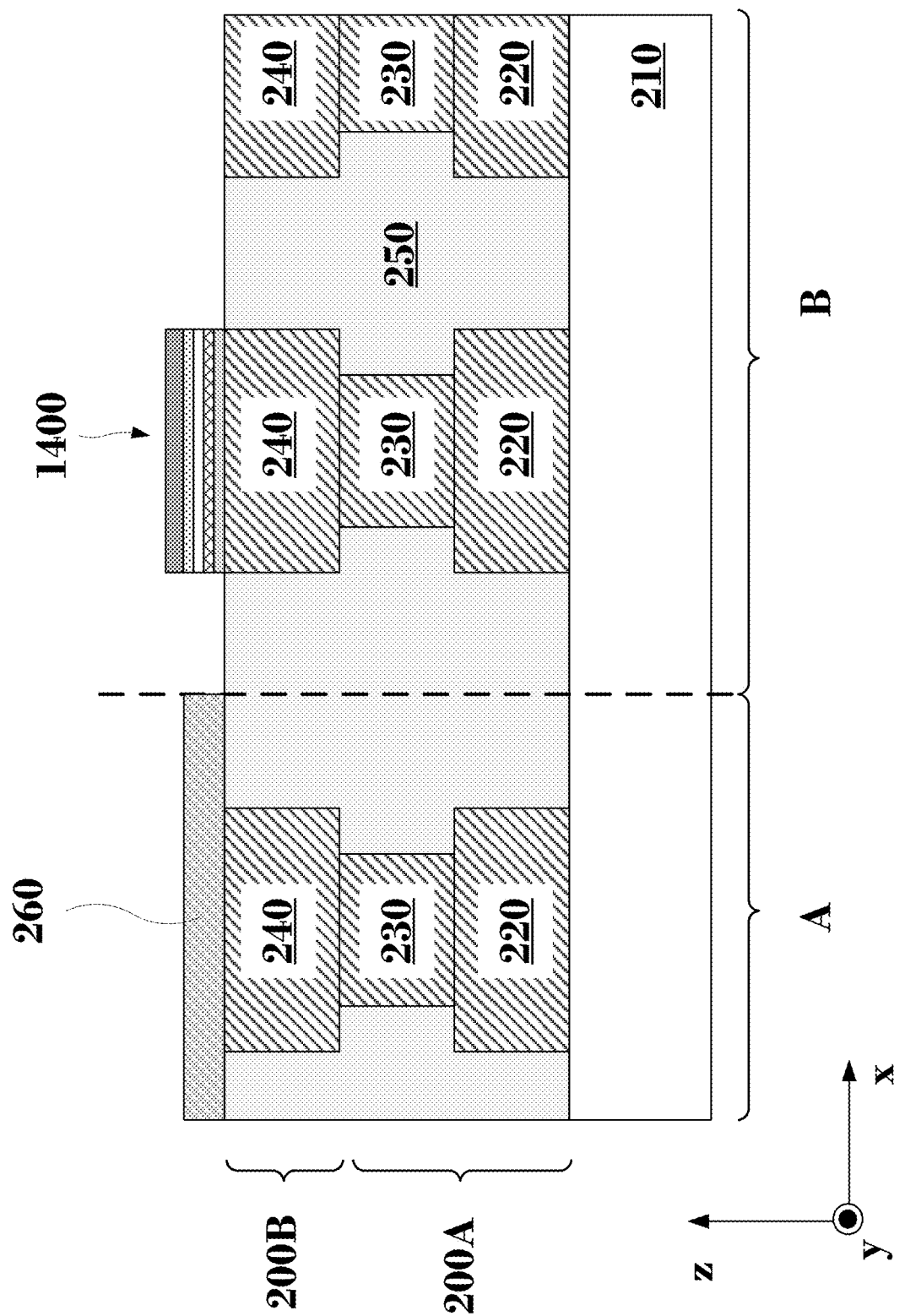
FIG. 14 a cross-sectional view of an RRAM structure formed on a top surface of a conductive structure, according to some embodiments.

In some embodiments, if recess 400 shown in FIG. 4 is not formed—in other words, if method 100 shown in FIG. 1 proceeds from operation 130 directly to operation 150—the resulting RRAM structure would not extend on the sidewall surfaces of conductive structure 240. For example, FIG. 14 shows an RRAM structure 1400 formed if optional operation 140 of method 100 is skipped and method 100 proceeds from operation 130 directly to operation 150. In some embodiments, RRAM structure 700 shown in FIG. 7 and RRAM structure 1400 shown in FIG. 14 are similar except that RRAM structure 700 extends to the sidewall surfaces of conductive structure 240 and RRAM structure 1400 does not. Therefore, the formation of recess 400 shown in FIG. 4 allows the RRAM structure to wrap around conductive structure 240 (e.g., extend to the sidewall surfaces of conductive structure 240).

Figure 15:
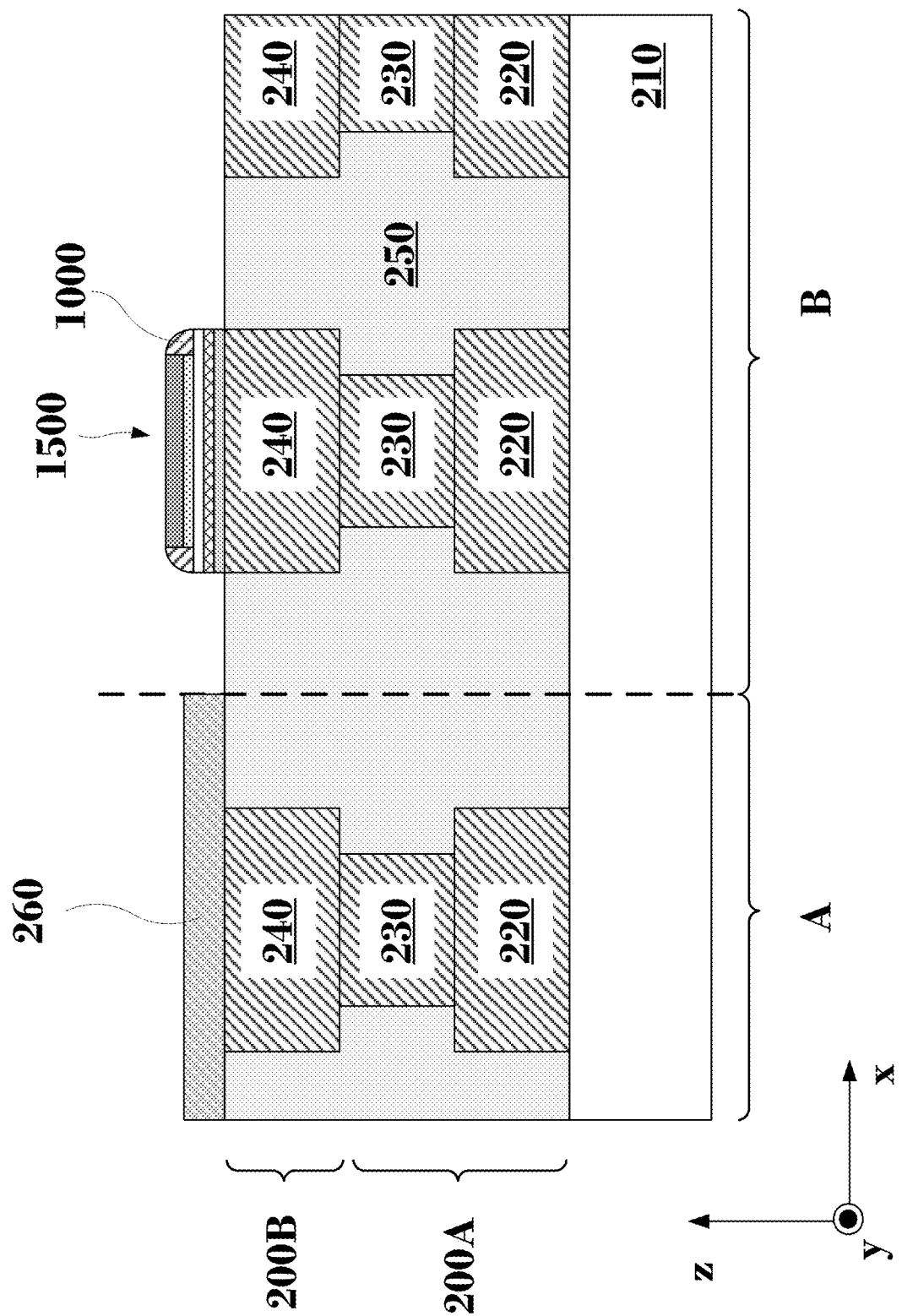
FIG. 15 a cross-sectional view of an RRAM structure, formed on a top surface of a conductive structure, with patterned layers and spacers formed on sidewall surfaces of the patterned layers, according to some embodiments.

In some embodiments, a variation of RRAM structure 1400 can be formed if additional photolithography and etching operations are performed. For example, FIG. 15 shows an RRAM structure 1500—a variation of RRAM structure 1400—which is similar to RRAM structure 1300 except that RRAM structure 1500 does not wrap around conductive structure 240 due the absence of a recess in dielectric layer 250 around conductive structure 240. By way of example and not limitation, RRAM structure 1500 can be formed using similar operations used for the formation of RRAM structure 1300 (e.g., with additional photolithography and etching operations).

For RRAM 1500, the width of the patterned photoresist can be adjusted to achieve desirable layer removal. For example, after the formation of the RRAM stack on metallization layer 200B in region B and on dielectric layer 260 in region A (e.g., like in FIG. 5), a first photoresist layer can be disposed on the RRAM stack and patterned so that the width of the patterned photoresist layer (e.g., along the x-axis) is shorter than the width of conductive structure 240. Subsequently, layers 540 and 550 of the RRAM stack can be patterned, like in FIG. 9. The first photoresist layer can be then stripped (e.g., removed) and a spacer material can be deposited on the patterned RRAM stack, on metallization layer 200B in region B, and on dielectric layer 260. A second photoresist layer can be disposed on the spacer material and patterned so that the width of the patterned photoresist layer (e.g., along the x-axis) is substantially equal to the width of conductive structure 240. An etching process can remove the portions of the spacer material and the RRAM stack not covered by the patterned photoresist to form the RRAM structure. The patterned photoresist can be then removed and a subsequent dry etching process, selective to the spacer material, can remove the spacer material from the top surface of the RRAM structure.

In some embodiments, any of exemplary RRAM structures 700, 1300, 1400, and 1500 or combinations thereof can be formed in region B of substrate 210.

In some embodiments, dielectric layer 250 may be dished from a planarization process during the formation of the conductive structures in metallization layer 200B. The dishing amount (e.g., the amount of dielectric layer removed by the planarization process) depends on the pitch of the conductive structures in metallization layer 200B (e.g., the distance between two adjacent conductive structures). For example, the dielectric dishing increases as the conductive structure pitch in metallization layer 200B increases. The resulting dishing may affect the formation of the RRAM structure. For example, if a recess is to be formed prior to the formation of the RRAM structure, the dishing amount would need to be taken into consideration during the recess formation in operation 130 of method 100. For example, if the dishing amount is significant, a recess with a high recess height (e.g., higher than the dishing amount) may be required to form RRAM structures 700 and 1300. If no recess is required, like in the formation of RRAM structures 1400 and 1500, the dishing amount may cause some unintentional wrapping around of the RRAM structure on the sidewall surfaces of conductive structure 240. This is because for aggressive dishing amounts, the sidewall surfaces of conductive structure 240 may be exposed, like when a recess is formed in dielectric layer 250.

Figure 16:
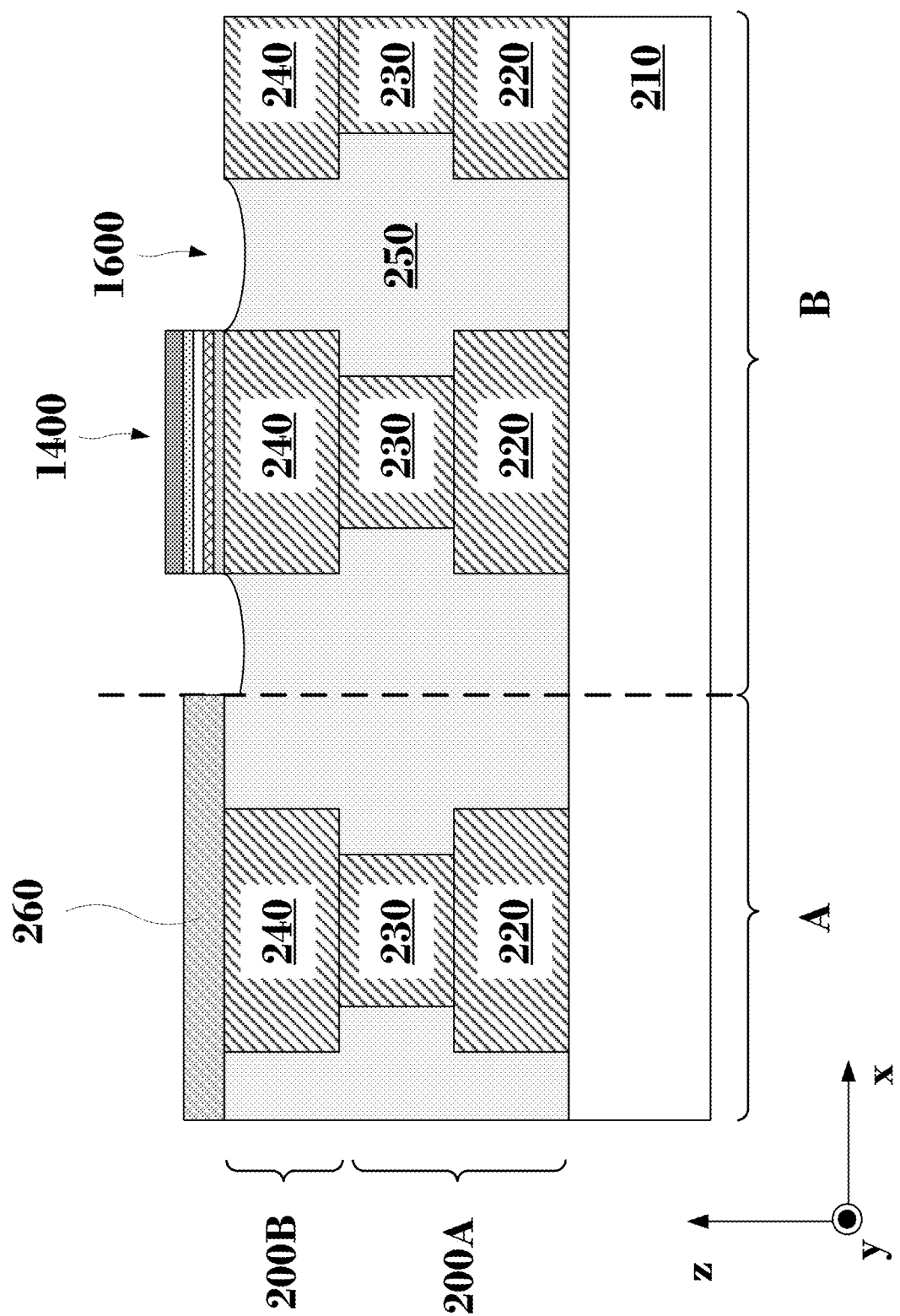
FIG. 16 is a cross-sectional view of a metallization layer with a dished dielectric from a planarization process and an RRAM structure formed on a top surface of a conductive structure in the metallization layer, according to some embodiments.
Figure 17:
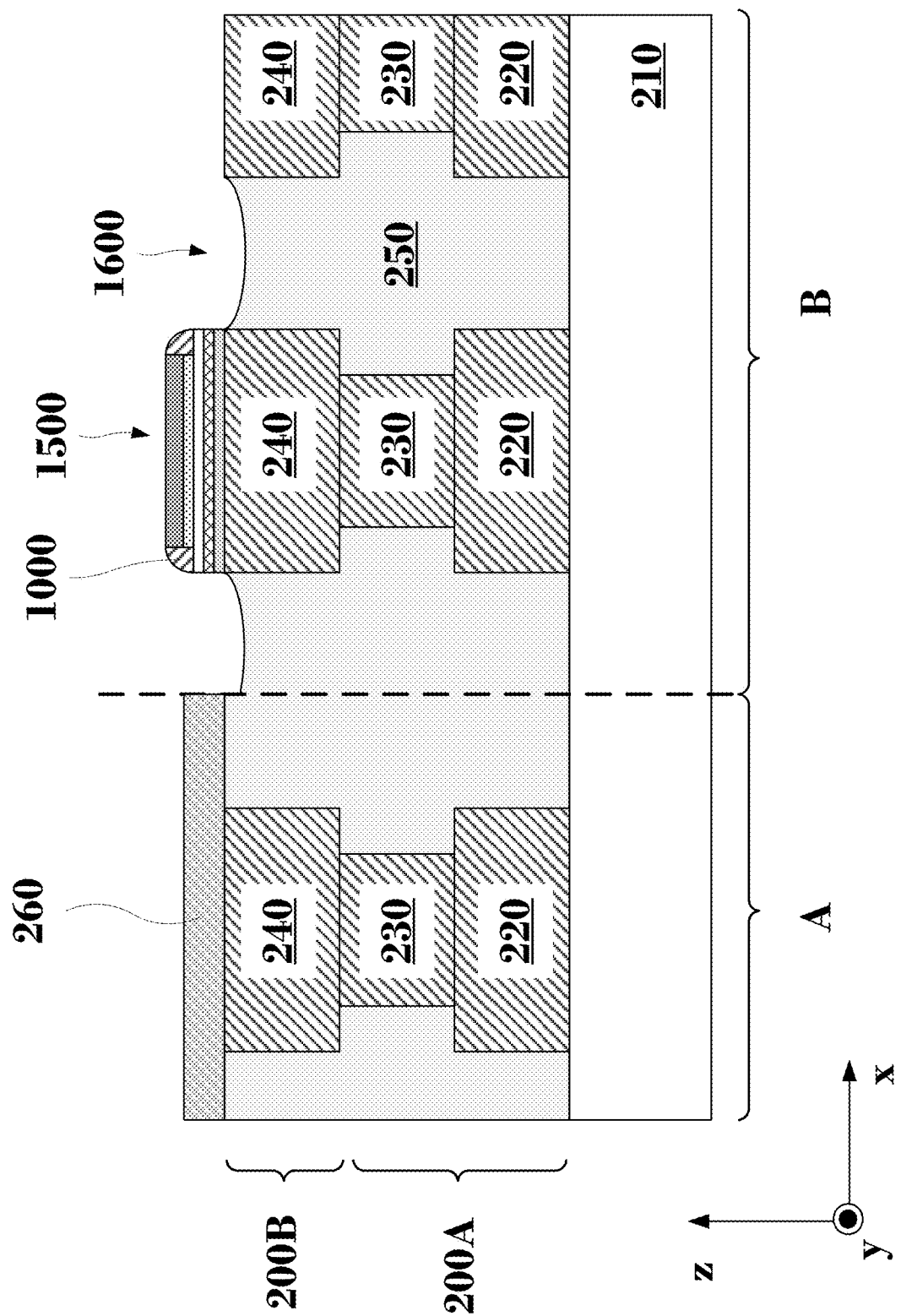
FIG. 17 is a cross-sectional view of a metallization layer with a dished dielectric from a planarization process and an RRAM structure with spacers formed on a top surface of a conductive structure in the metallization layer, according to some embodiments.

By way of example and not limitation, FIGS. 16 and 17 show RRAM structures 1400 and 1500 when dishing 1600 in dielectric layer 250 occurs by a planarization process, such as a chemical mechanical planarization (CMP) process. In the examples of FIGS. 16 and 17, the dishing amount does not expose the sidewall surfaces of conductive structure 240, and therefore RRAM structures 1400 and 1500 do not wrap around conductive structure 240. As discussed above, this is not limiting and RRAM structures that partially wrap around conductive structures 240 is possible if the dishing in dielectric layer 250 exposes the sidewall surfaces of conductive structure 240.

Figure 18:
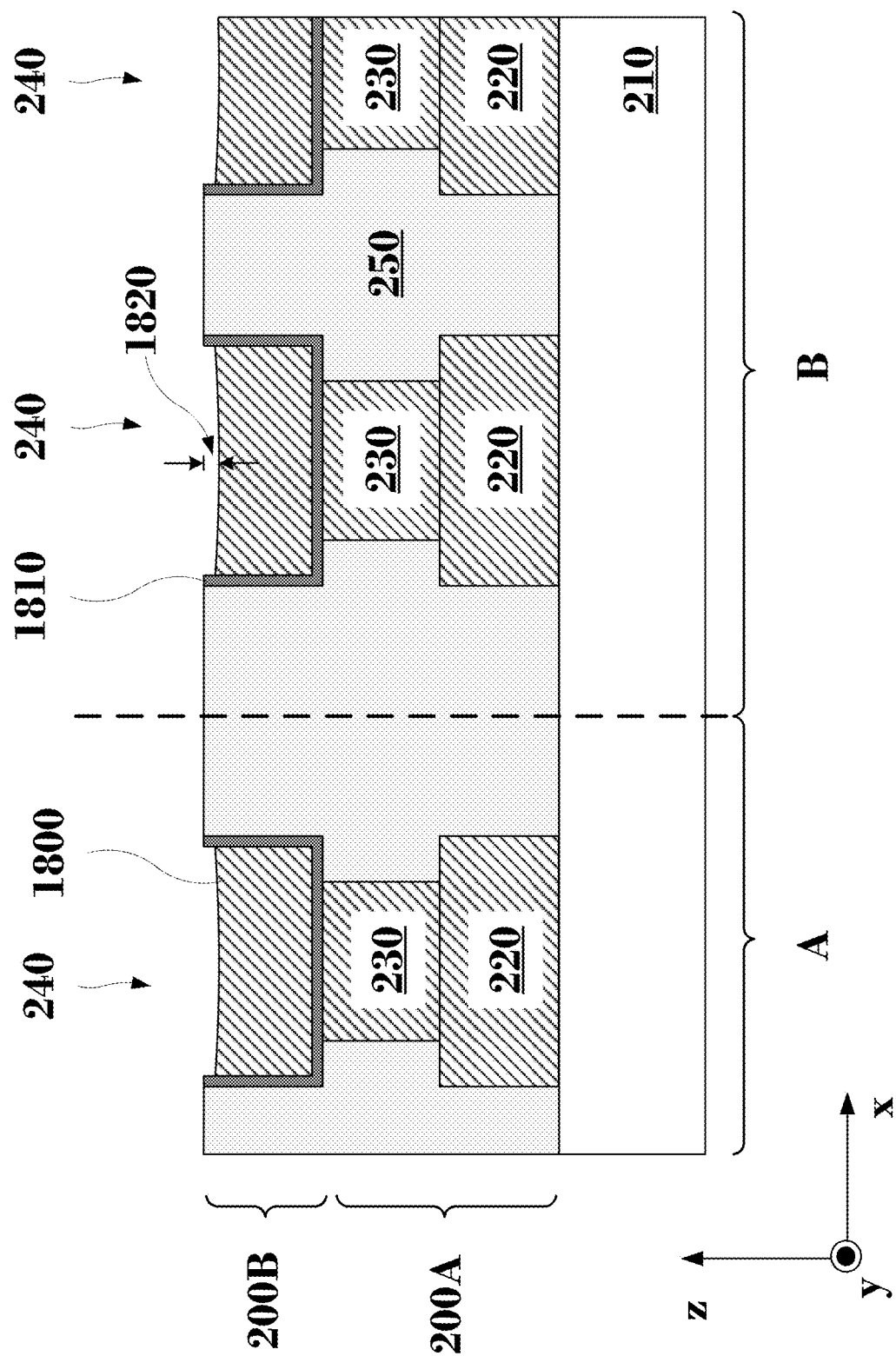
FIG. 18 is a cross-sectional view of a metallization layer with dished conductive structures from a planarization process, according to some embodiments.

In some embodiments, another effect of the planarization process is the appearance of dishing within the conductive structures of the interconnect layer. Each conductive structure 220, 230, and 240 of interconnect layers 200A and 200B includes liner layers and conductive materials, which can have slightly different polishing rates for a CMP process. For example, the conductive material may polish slightly faster than the liner layer. As a result, and as shown in FIG. 18, within conductive structures 240, conductive material 1800 can appear dished or "pulled back" compared to liner layer 1810. In some embodiments, conductive material 1800 is dished or pulled back by an amount 1820 less than about 5 nm (e.g., between 0 and less than about 5 nm). Therefore, the top surface or conductive material 1800 in conductive structure 240 will not be coplanar with the top surface of liner layer 1810. The surface topography of conductive structure 240 affects the shape of the RRAM structure formed thereon. In some embodiments, the RRAM structures formed on conductive structure 240 of FIG. 18 will develop a step-like topography, which does not substantially affect the total height of the formed RRAM stack. For example, FIGS. 19-22 show different variations of RRAM structures formed on conductive structure 240 of FIG. 18 using method 100 shown in FIG. 1. In some embodiments, the RRAM structures in FIGS. 19-22 (e.g., RRAM structures 1900, 2000, 2100, and 2200) have a height on conductive structure 240 that is substantially equal to the height of the RRAM structures in FIGS. 7, 13, 14, and 15 (e.g., RRAM structures 700, 1300, 1400, and 1500).

Figure 19:
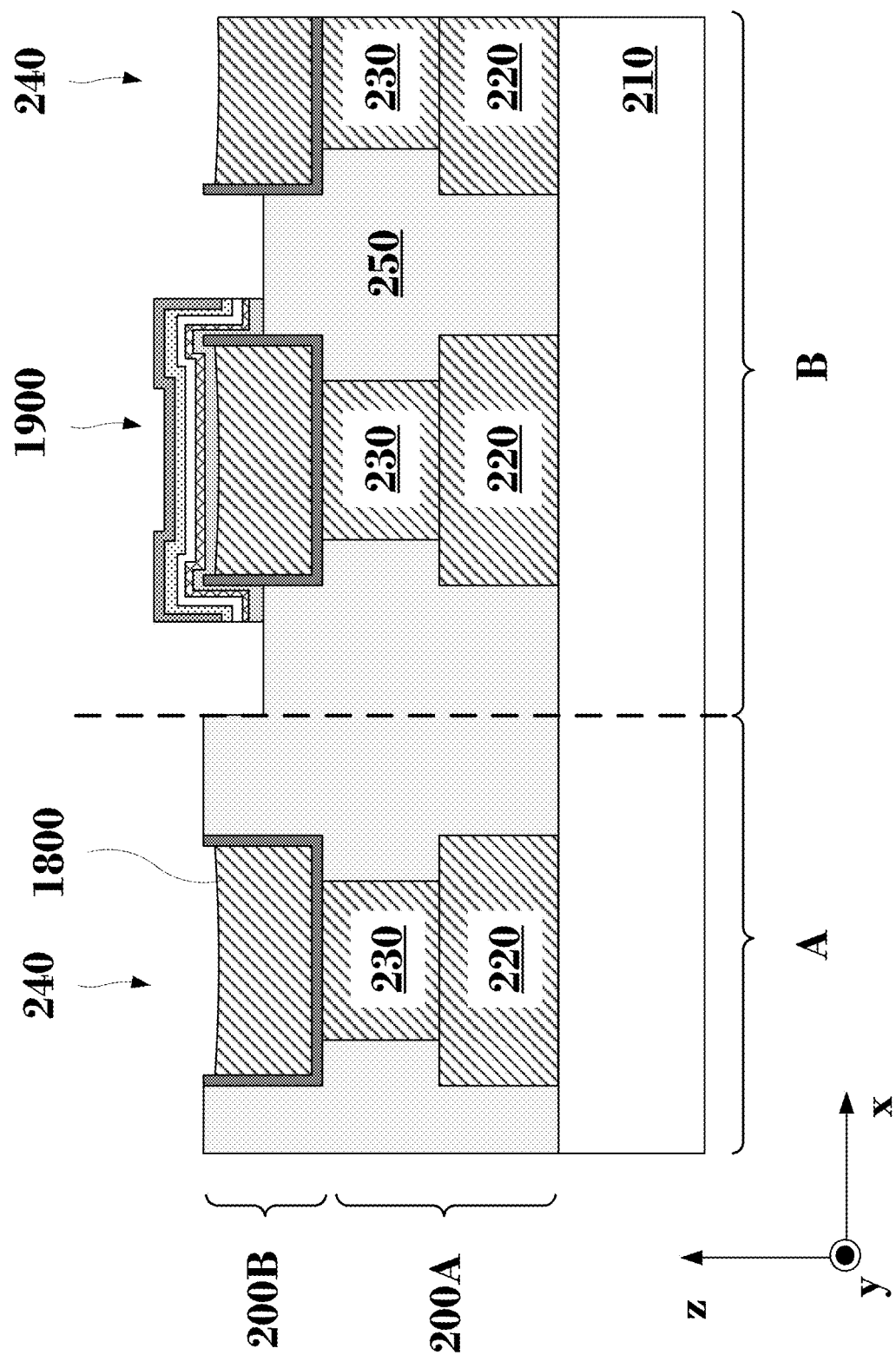
FIG. 19 is a cross-sectional view of an RRAM structure on sidewall and top surfaces of a dished conductive structure from a planarization process, according to some embodiments.
Figure 20:
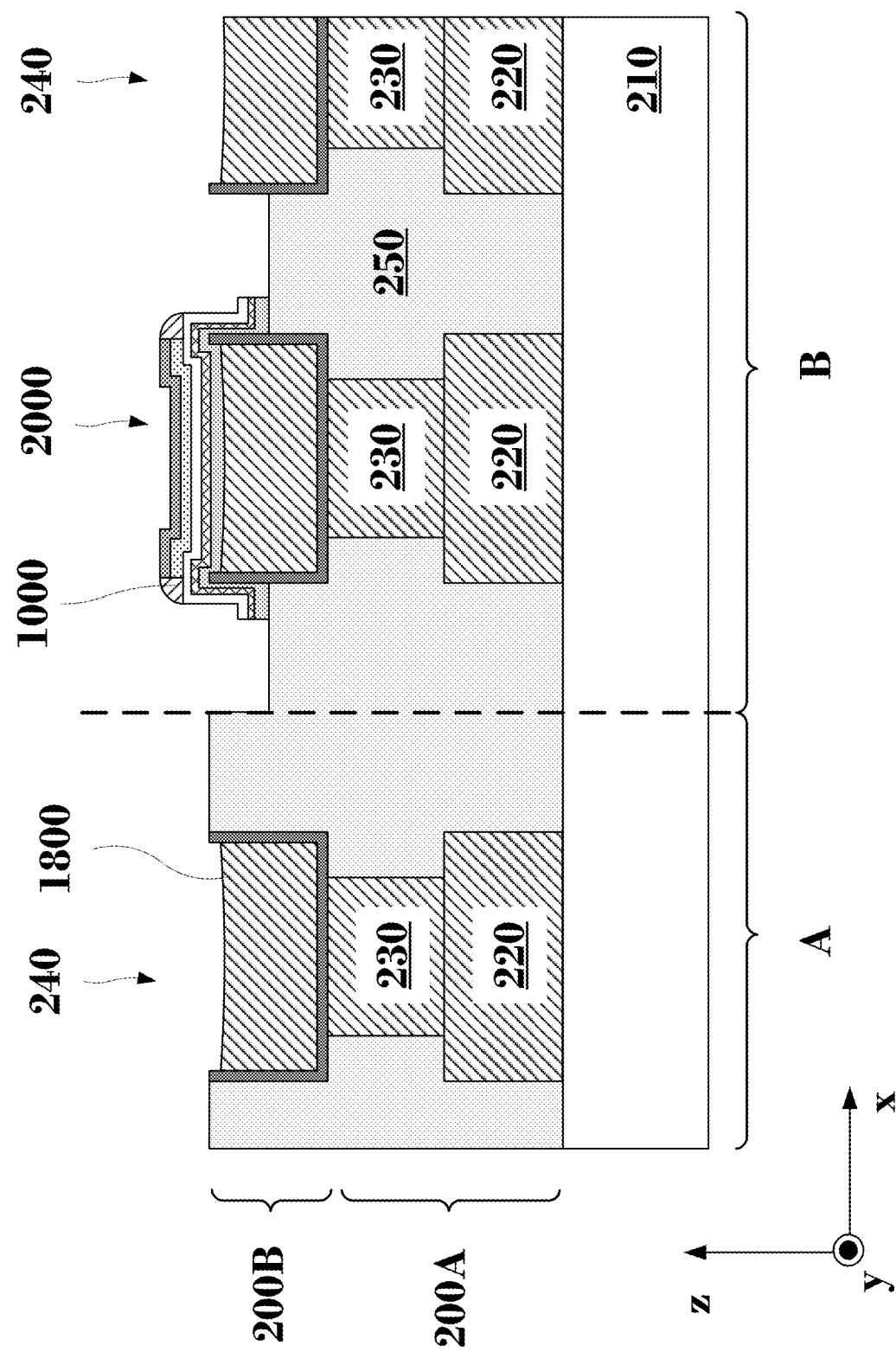
FIG. 20 is a cross-sectional view of an RRAM structure with spacers on sidewall and top surfaces of a dished conductive structure from a planarization process, according to some embodiments.
Figure 21:
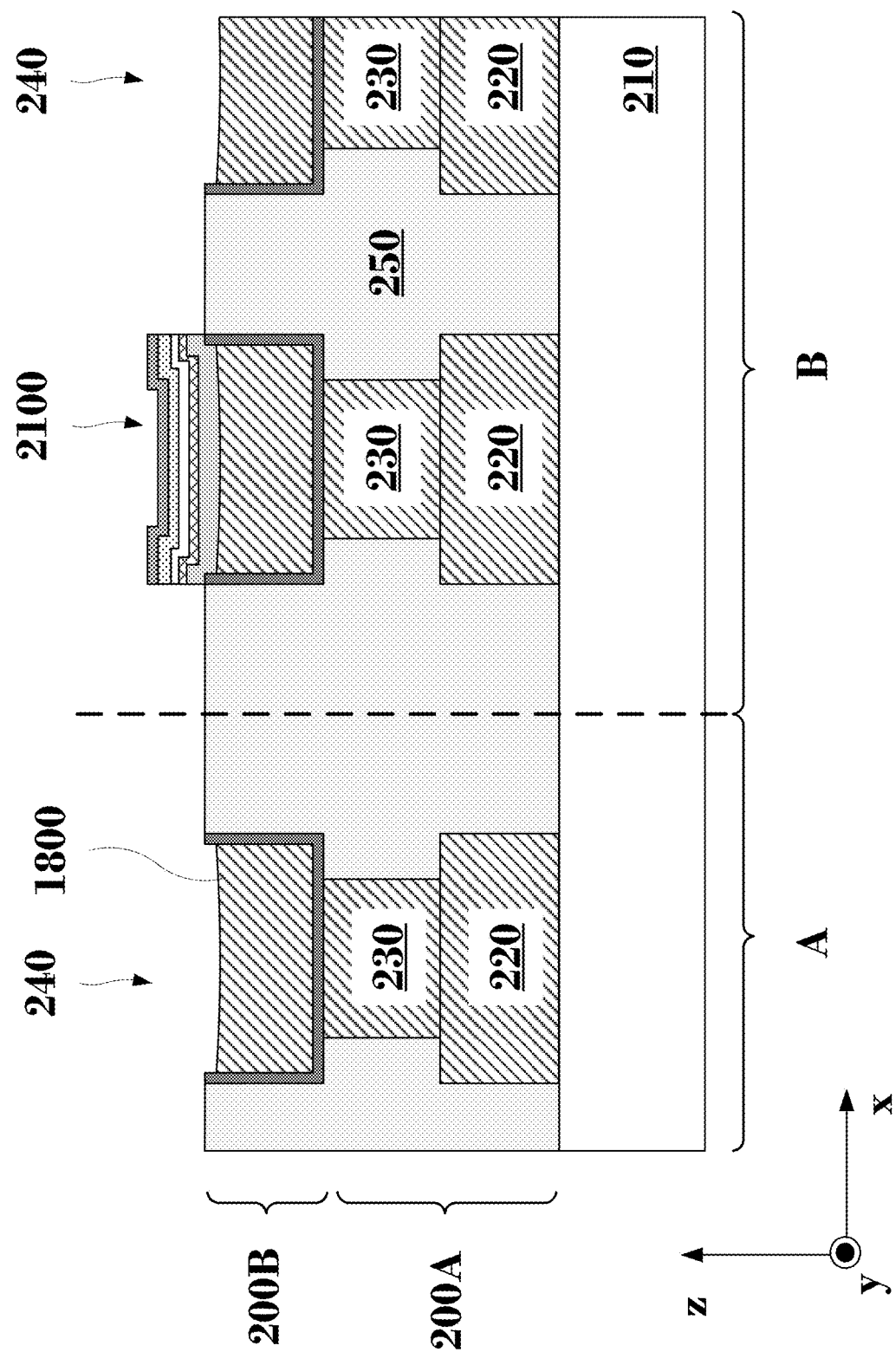
FIG. 21 is a cross-sectional view of an RRAM structure on a top surface of a dished conductive structure from a planarization process, according to some embodiments.
Figure 22:
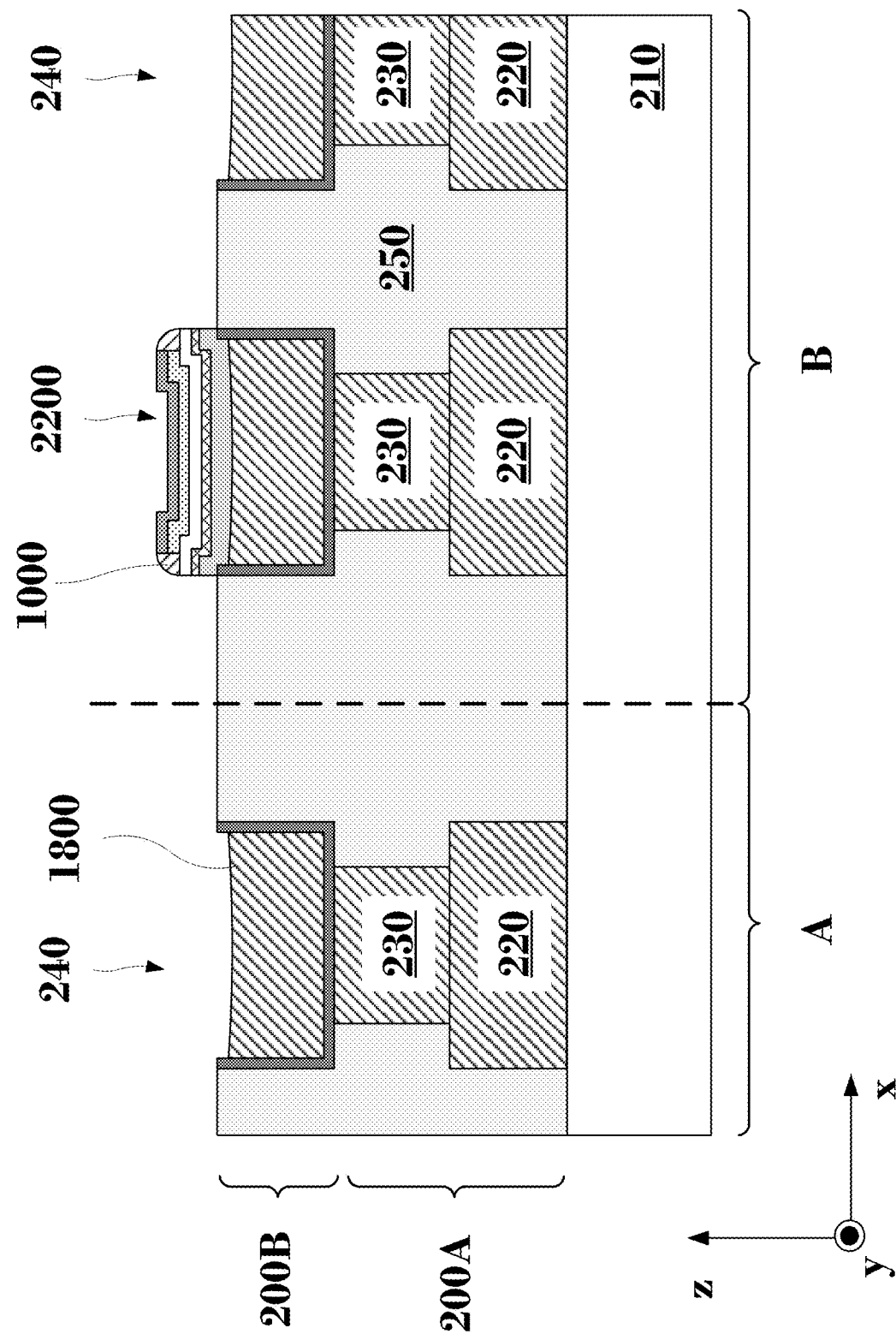
FIG. 22 is a cross-sectional view of an RRAM structure with spacers on a top surface of a dished conductive structure from a planarization process, according to some embodiments.

More specifically, FIG. 19 shows an RRAM structure 1900 wrapped around conductive structure 240 because a recess in dielectric layer 250 was formed using optional operation 140 of method 100. In some embodiments, RRAM structure 1900 is a variation of RRAM structure 700 shown in FIG. 7. RRAM structure 1900, contrary to RRAM structure 700, features a step-like topography as a result of the surface topography in conductive structure 240 shown in FIG. 18. FIG. 20 shows an RRAM structure 2000 with a step-like topography and spacer material 1000. According to some embodiments, RRAM structure 2000 is similar to RRAM structure 1300, shown in FIG. 13. As discussed above, RRAM structure 2000, like RRAM structure 1300, can be formed if additional patterning operations are used after the deposition of the RRAM layers. FIG. 21 shows an RRAM structure 2100 with a step-like topography not wrapped around conductive structure 240 because optional operation 140 of method 100 shown in FIG. 1 was skipped. Therefore, a recess was not formed in dielectric layer 250 of metallization layer 200B. In some embodiments, the length of RRAM structure 2200 is equal to or less that the length of conductive structure 240 along the x-axis. Finally, FIG. 22 shows RRAM structure 2100 with a step-like topography and spacer material 1000 not wrapped around conductive structure 240, according to some embodiments. By way of example and not limitation, and except from the step-like topography, RRAM structure 2200 is similar to RRAM structure 1500 shown in FIG. 15.

According to some embodiments, RRAM structures 700, 1300, 1400, 1500, 1900, 2000, 2100, 2200, or combinations thereof can be formed on region B of substrate 210.

Figure 23:
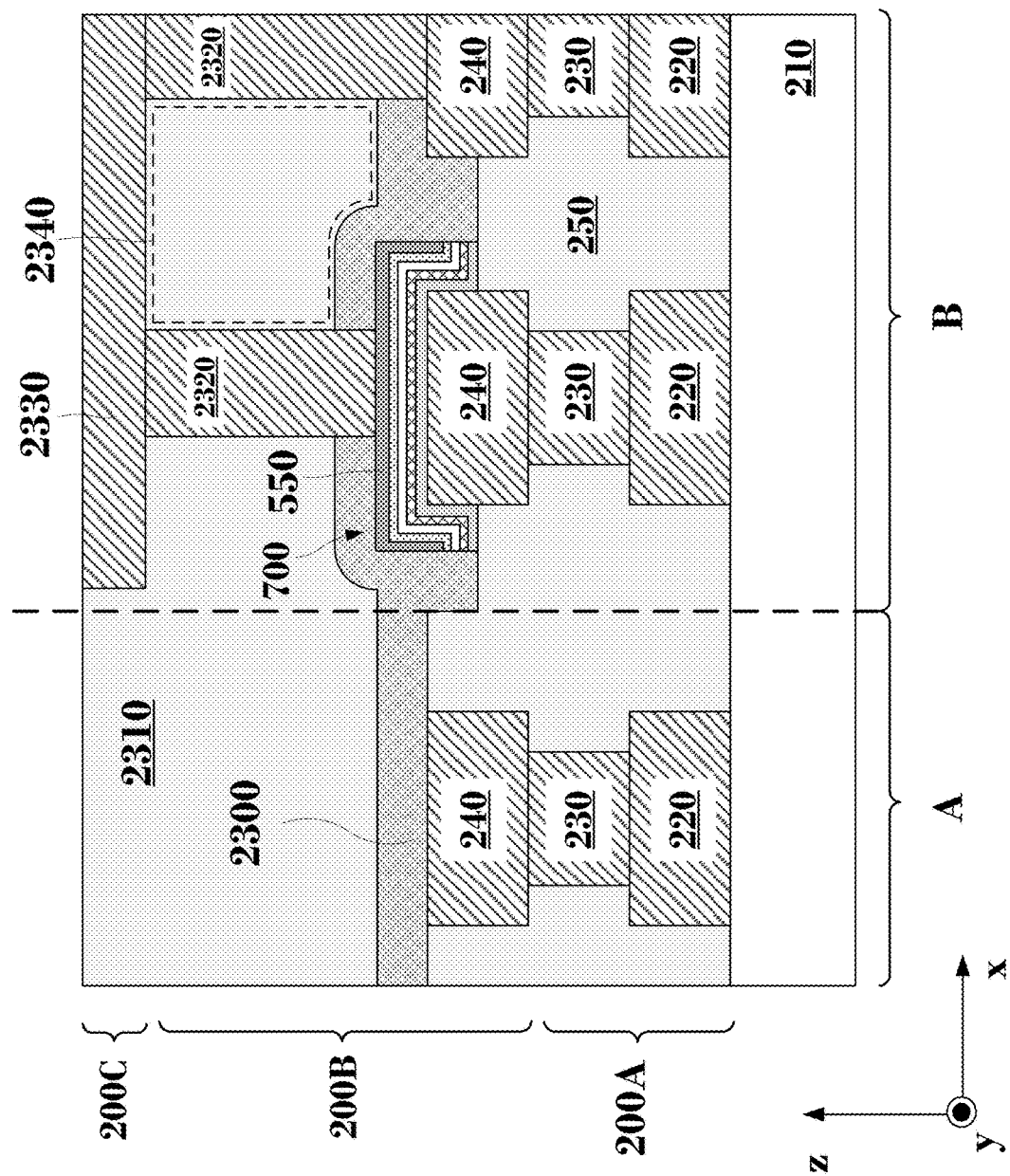
FIG. 23 is a cross-sectional view of an RRAM structure on sidewall and top surfaces of a conductive structure between metallization layers, according to some embodiments.

By way of example and not limitation, FIG. 23 shows RRAM structure 700 after the formation of additional conductive structures 2320 and 2330. By way of example and not limitation, conductive structure 2320 can be part of metallization layer 200B and conductive structure 2330 can be part of another metallization layer 200C. In some embodiments, one of the conductive structures 2320 connects the top electrode of RRAM structure 700 (e.g., layer 550 of RRAM structure 700) to conductive structure 2330 of metallization layer 200C.

By way of example and not limitation, the structure of FIG. 23 can be formed as follows. After operation 160 of method 100 described by FIG. 1, a dielectric layer 2300 is deposited on the exposed surfaces of conductive structures 240, dielectric layer 250, and RRAM structure 700. In some embodiments, dielectric layer 2300 encapsulates RRAM structure 700. By way of example and not limitation, dielectric layer 2300 can be similar or different to dielectric layer 260 shown in FIG. 2. Subsequently, a dielectric layer 2310 is deposited on dielectric layer 2300. By way of example and not limitation, dielectric layer 2300 can be similar or different to dielectric layer 250—for example, dielectric layer 2310 can be a stack of dielectric layers. Conductive structures 2320 and 2330 can be formed in dielectric layer 2310 with a metallization process, such as a dual damascene process or any other suitable metallization process.

In some embodiments, the low profile of RRAM structure 700 (e.g., height 700H) reduces the risk of void formation in a dielectric area 2340, which is located above RRAM structure 700 and between conductive structures 2320. This is because height 700H of RRAM structure 700 provides a less challenging topography for the deposition of dielectric layer 2310 as opposed to an RRAM structure with a "raised" thickness profile, which can include intervening layers between the RRAM structure and the underlying conductive structure. In some embodiments, dielectric area 2340 is located between conductive structures 2320 formed on adjacent RRAM structures. According to some embodiments, variations of RRAM structure 700, such as RRAM structures 1300, 1400, 1500, 1900, 2000, 2100, and 2200, have a similar low profile as RRAM structure 700.

The layout of the conductive structures shown in FIG. 23 is exemplary and not limiting. For example, additional or different layouts are possible. Further, additional layers, not shown in FIG. 23, can be formed below metallization layer 200A or above metallization layer 200C. By way of example and not limitation, these additional layers can include additional conductive structures, memory structures, resistor structures, transistors, structures capacitors, other chip elements, or combinations thereof. By way of example and not limitation, these additional layers can be disposed on substrate 210. In some embodiments, substrate 210 can be a semiconductor wafer (e.g., a silicon wafer), a semiconductor on insulator wafer, an interposer, a transfer wafer, or a dielectric substrate (e.g., quartz). In some embodiments, more than one memory structures are possible between or within interconnect layers 200A, 200B, and 200C. Therefore, FIG. 23 may include additional RRAM structures like RRAM structures 1300, 1400, 1500, 1900, 2000, 2100, 2200, combinations thereof, or other memory structures and elements. Further, additional conductive structures may be formed between or within layers 200A, 200B, and 200C.

The methods and embodiments described herein for RRAM structures 700, 1300, 1400, 1500, 1900, 2000, 2100, and 2200 are not limited to BEOL interconnect layers. For example the method and embodiments described herein can be applied to other metallization layers, such as middle of the line layers (MOL), between a MOL and a BEOL layer, or other parts of the chip.

The embodiments described herein are directed to a method for the formation of RRAM structures with a low profile between or within metallization layers. The low profile facilitates the subsequent deposition of one or more dielectric layers between RRAM structures or between the RRAM structures and the conductive structures of the metallization layers. In some embodiments, the RRAM structures with the low profile reduce the risk of void formation during the subsequent dielectric layer deposition. For this reason, embodiments described herein can be suitable for ICs with reduced via and line pitch. In some embodiments, the RRAM structures with a low profile wrap around the sidewall surfaces of the underlying conductive structures. In some embodiments, the RRAM structures with the low profile are formed on conductive structures without wrapping around the sidewall surfaces of the conductive structures. In some embodiments, the sidewall surfaces of a conductive structure are covered partially with layers from the RRAM structure. In some embodiments, the RRAM structure is formed on a top surface of the conductive structure. A top electrode of an RRAM structure can patterned so that spacers can be formed on the sidewall surfaces of the top electrode to improve the electrical isolation between the top and bottom electrodes, according to some embodiments. In additional embodiments, the sidewall surfaces of the RRAM structures are substantially vertical.

In some embodiments, a semiconductor structure includes a substrate and a metallization layer on the substrate, where the metallization layer comprises first and second conductive structures surrounded by a first dielectric. The semiconductor structure further includes a memory structure formed on top and sidewall surfaces of the first conductive structures, where a portion of the first dielectric surrounding the first conductive structures is recessed relative to portions of the first dielectric surrounding the second conductive structures. Also the semiconductor structure includes a second dielectric formed (i) on the memory structures, (ii) on the first dielectric, and (iii) on the second conductive structures, where the second dielectric surrounds top and sidewall surfaces of the memory structure. Finally, the semiconductor structure includes a third dielectric formed on the second dielectric.

In some embodiments, a method for forming a memory structure includes forming, on a substrate, a first metallization layer with conductive structures and a first dielectric layer abutting sidewall surfaces of the conductive structures; etching a portion of the first dielectric layer to expose a portion of the sidewall surfaces of the conductive structures; depositing a memory stack on the first metallization layer, the exposed portion of the sidewall surfaces, and a top surface of the conductive structures; patterning the memory stack to form a memory structure that covers the exposed portion of the sidewall surfaces and the top surface of the conductive structures; depositing a second dielectric layer to encapsulate the memory stack; and forming a second metallization layer on the second dielectric layer.

In some embodiments, a method for forming a memory structure includes forming, on a substrate, a first metallization layer with conductive structures and a first dielectric layer abutting sidewall surfaces of the conductive structures; depositing a memory stack on the first metallization layer and a top surface of the conductive structures; patterning the memory stack to form a memory structure on the top surface of the conductive structures, where the memory structure has a width substantially equal to that of the conductive structures. The method further includes depositing a second dielectric layer to encapsulate the memory stack; and forming a second metallization layer on the second dielectric layer.

The foregoing outlines features of embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a memory structure, comprising:
   forming a first metallization layer on a substrate, wherein the first metallization layer comprises first and second conductive structures;
   forming a first dielectric layer, wherein a top surface of the first dielectric layer is substantially coplanar with top surfaces of the first and second conductive structures;
   etching a first portion of the first dielectric layer surrounding the first conductive structure, such that the first portion of the first dielectric layer is recessed relative to a second portion of the first dielectric layer surrounding the second conductive structure:
   depositing a memory stack on the first portion of the first dielectric layer and on the top surface of the first conductive structure; and
   patterning the memory stack to form a memory structure that covers the top surface of the first conductive structure.

2. The method of claim 1, wherein the first portion of the first dielectric layer is recessed relative to the second portion of the first dielectric layer surrounding the second conductive structure by a height substantially equal to or less than that of the first conductive structure.

3. The method of claim 1, wherein patterning the memory stack comprises:
   patterning a top electrode layer of the memory stack so that a width of the patterned top electrode layer is greater than that of the first conductive structure; and
   forming a spacer on a sidewall surface of the patterned top electrode layer.

4. The method of claim 1, wherein patterning the memory stack comprises removing portions of the memory stack not deposited on the top surface and sidewall surfaces of the first conductive structure.

5. The method of claim 1, wherein depositing the memory stack comprises:
   depositing a bottom electrode layer on sidewall surfaces and the top surfaces of the first and second conductive structures;
   depositing a third dielectric layer on the bottom electrode layer; and
   depositing a top electrode layer on the third dielectric layer.

6. The method of claim 5, further comprising depositing a capping layer between the third dielectric layer and the top electrode layer.

7. A method for forming a memory structure, comprising:
   forming first and second conductive structures on a substrate, wherein the first and second conductive structures comprise first and second pairs of sidewall surfaces, respectively;
   depositing a dielectric layer on the substrate, wherein first and second portions of the dielectric layer cover the first and second pairs of sidewall surfaces, respectively;
   forming a masking layer on the second conductive structure and the second portion of the dielectric layer;
   etching the first portion of the dielectric layer such that:
      portions of the first pair of sidewall surfaces are exposed; and
      the second portion of the dielectric layer is protected by the masking layer; and
   forming a memory stack on the exposed portions of the first pair of sidewall surfaces and on a top surface of the first conductive structure.

8. The method of claim 7, further comprising:
   etching a top electrode layer of the memory stack to a width greater than that of the first conductive structure.

9. The method of claim 7, wherein forming the memory stack comprises:
   depositing a bottom electrode layer;
   depositing an other dielectric layer on the bottom electrode layer; and
   depositing a top electrode layer on the other dielectric layer.

10. The method of claim 9, further comprising depositing a capping layer between the other dielectric layer and the top electrode layer.

11. The method of claim 7, wherein etching the first portion of the dielectric layer comprises recessing the first portion of the dielectric layer relative to the second portion of the dielectric layer by a height substantially equal to or less than that of the first conductive structure.

12. A method for forming a memory structure, comprising:
   forming first and second conductive structures on a substrate;
   depositing a dielectric layer on the substrate;
   etching a first portion of the dielectric layer surrounding the first conductive structure, such that the first portion of the dielectric layer is recessed relative to a second portion of the dielectric layer surrounding the second conductive structure;
   depositing a memory stack on the first and second portions of the dielectric layer and on the first and second conductive structures; and
   patterning the memory stack to form a memory structure that covers a top surface of the first conductive structure.

13. The method of claim 12, wherein the first portion of the dielectric layer is recessed relative to the second portion of the dielectric layer by a height substantially equal to or less than that of the first conductive structure.

14. The method of claim 12, wherein depositing the memory stack comprises:
   depositing a bottom electrode layer;
   depositing an other dielectric layer on the bottom electrode layer; and
   depositing a top electrode layer on the other dielectric layer.

15. The method of claim 14, further comprising depositing a capping layer between the other dielectric layer and the top electrode layer.

16. The method of claim 1, wherein the memory structure has a height between about 27 nm and about 33 nm.

17. The method of claim 7, wherein etching the first portion of the dielectric layer comprises etching the first portion of the dielectric layer by a height substantially equal to or less than that of the first conductive structure.

18. The method of claim 9, wherein the other dielectric layer comprises hafnium oxide, zirconium oxide, aluminum oxide, nickel oxide, tantalum oxide, or titanium oxide.

19. The method of claim 12, further comprising:
   forming an other dielectric layer on the second portion of the dielectric layer surrounding the second conductive structure;
   etching, while etching the first portion of the dielectric layer, the other dielectric layer; and
   terminating the etching of the first portion of the dielectric layer after the other dielectric layer is removed.

20. The method of claim 19, wherein an etching selectivity ratio of the other dielectric layer and the dielectric layer is about 1:2.

* * * * *

UNITED STATES PATENT AND TRADEMARK OFFICE
CERTIFICATE OF CORRECTION

| | |
|---|---|
| PATENT NO. | : 11,678,592 B2 |
| APPLICATION NO. | : 17/329247 |
| DATED | : June 13, 2023 |
| INVENTOR(S) | : Wang et al. |

It is certified that error appears in the above-identified patent and that said Letters Patent is hereby corrected as shown below:

In the Claims

In Column 14, Claim 1, Line 58, delete "structure:" and insert -- structure; --, therefor.

Signed and Sealed this
Fifth Day of September, 2023

Katherine Kelly Vidal
*Director of the United States Patent and Trademark Office*